US012764942B2

(12) United States Patent
Lee et al.

(10) Patent No.: US 12,764,942 B2
(45) Date of Patent: Oct. 13, 2026

(54) SEMICONDUCTOR DEVICE

(71) Applicant: SAMSUNG ELECTRONICS CO., LTD., Suwon-si (KR)

(72) Inventors: Yanghee Lee, Suwon-si (KR); Jonghyuk Park, Suwon-si (KR); Ilyoung Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 272 days.

(21) Appl. No.: 18/622,473

(22) Filed: Mar. 29, 2024

(65) Prior Publication Data

US 2024/0341086 A1 Oct. 10, 2024

(30) Foreign Application Priority Data

Apr. 10, 2023 (KR) ........................ 10-2023-0046856

(51) Int. Cl.
*H10B 12/00* (2023.01)

(52) U.S. Cl.
CPC ........... *H10B 12/482* (2023.02); *H10B 12/09* (2023.02); *H10B 12/50* (2023.02)

(58) Field of Classification Search
CPC ....... H10B 12/482; H10B 12/50; H10B 12/09
See application file for complete search history.

(56) References Cited

U.S. PATENT DOCUMENTS 9,012,965 B2 4/2015 Luo et al.
9,337,105 B1 5/2016 Kwon et al.
10,074,656 B1 * 9/2018 Wang ................. H10B 12/0335
2002/0055246 A1 * 5/2002 Jiang ...................... H10D 84/00 438/597
2007/0281417 A1 * 12/2007 Baars ..................... H10B 12/50 438/238
2011/0294276 A1 12/2011 Kuroki
2012/0220114 A1 8/2012 Cai et al.
2016/0141289 A1 5/2016 Aono et al.
2016/0181143 A1 * 6/2016 Kwon ................ H10W 20/072 438/586

(Continued)

FOREIGN PATENT DOCUMENTS

KR 10-2018-0057812 5/2018
KR 10-2018-0097510 8/2018

(Continued)

*Primary Examiner* — Nathan W Ha
(74) *Attorney, Agent, or Firm* — Fish & Richardson P.C.

(57) ABSTRACT

An example semiconductor device includes a bit line structure and a bit line capping pattern that are stacked on a memory cell array region. The device further includes a peripheral gate structure including a peripheral gate dielectric layer, a peripheral gate electrode, and a peripheral gate capping pattern that are stacked on a peripheral circuit region. The device further includes a gate spacer on a side surface of the peripheral gate structure, a first peripheral interlayer insulating layer covering the peripheral gate structure and the gate spacer, and a first peripheral contact plug penetrating through the first peripheral interlayer insulating layer. The bit line capping pattern includes a lower bit line capping layer and an upper bit line capping layer that are stacked. A material of the upper bit line capping layer is same as a material of the first peripheral interlayer insulating layer.

20 Claims, 22 Drawing Sheets

(56) References Cited

U.S. PATENT DOCUMENTS

| | | | | |
|---|---|---|---|---|
| 2018/0145082 | A1 | 5/2018 | Hong et al. | |
| 2019/0296019 | A1* | 9/2019 | Wu | H10B 12/315 |
| 2019/0319030 | A1* | 10/2019 | Huang | H10B 12/09 |
| 2020/0227269 | A1* | 7/2020 | Liu | H10D 64/021 |
| 2024/0147697 | A1 | 5/2024 | Lee et al. | |

FOREIGN PATENT DOCUMENTS

| | | |
|---|---|---|
| KR | 10-2174144 | 11/2020 |
| KR | 10-2024-0061372 | 5/2024 |
| WO | WO 2017/058279 | 4/2017 |

* cited by examiner

SEMICONDUCTOR DEVICE

CROSS-REFERENCE TO RELATED APPLICATION

This application claims priority to Korean Patent Application No. 10-2023-0046856, filed on Apr. 10, 2023, in the Korean Intellectual Property Office, the disclosure of which is incorporated herein by reference in its entirety.

BACKGROUND

The present disclosure relates to a semiconductor device and a method of manufacturing the same.

Research has been conducted to reduce sizes of elements included in a semiconductor device and to improve performance thereof. For example, in a DRAM, research has been conducted to reliably and stably form reduced-size elements.

SUMMARY

An example implementation of the present disclosure is to provide a semiconductor device including a stable contact plug having reliability.

Another example implementation of the present disclosure is to provide a method of manufacturing the semiconductor device.

In some implementations, a semiconductor device includes a bit line structure and a bit line capping pattern stacked in order on a memory cell array region of a substrate; a peripheral gate structure including a peripheral gate dielectric layer, a peripheral gate electrode on the peripheral gate dielectric layer, and a peripheral gate capping pattern on the peripheral gate electrode on a peripheral circuit region of the substrate; a gate spacer on a side surface of the peripheral gate structure; a first peripheral interlayer insulating layer covering the peripheral gate structure and the gate spacer on the peripheral circuit region of the substrate; and a first peripheral contact plug penetrating through the first peripheral interlayer insulating layer, wherein the bit line capping pattern includes a lower bit line capping layer and an upper bit line capping layer stacked in order, wherein a material of the upper bit line capping layer is the same as a material of the first peripheral interlayer insulating layer, wherein an upper end of the first peripheral interlayer insulating layer is disposed at a level higher than a level of an upper surface of the peripheral gate capping pattern, and wherein a lower end of the first peripheral interlayer insulating layer is disposed at a level lower than a level of a lower surface of the peripheral gate electrode.

In some implementations, a semiconductor device includes a first lower structure disposed on a memory cell array region of a substrate and including a cell device isolation region defining a cell active region and a cell gate structure; a second lower structure disposed on a peripheral circuit region of the substrate and including a peripheral device isolation region defining a peripheral active region; a bit line structure and a bit line capping pattern stacked in order on the first lower structure; a peripheral gate structure on the second lower structure; gate spacers on side surfaces of the peripheral gate structure; a peripheral interlayer insulating layer disposed on the second lower structure and covering the peripheral gate structure and the gate spacers; a peripheral contact plug penetrating through the peripheral interlayer insulating layer and electrically connected to a peripheral source/drain region in the peripheral active region; and a peripheral interconnection line electrically connected to the peripheral contact plug and in contact with an upper surface of the peripheral interlayer insulating layer, wherein the peripheral gate structure includes a peripheral gate dielectric layer, a peripheral gate electrode, and a peripheral gate capping pattern stacked in order, a lower end of the peripheral interlayer insulating layer is disposed at a level lower than a level of a lower surface of the peripheral gate electrode, wherein the bit line capping pattern includes a lower bit line capping layer and an upper bit line capping layer stacked in order, and wherein a material of the upper bit line capping layer is the same as a material of the peripheral interlayer insulating layer.

In some implementations, a semiconductor device includes a first lower structure disposed on the memory cell array region of the substrate and including a cell device isolation region defining a cell active region and a cell gate structure; a second lower structure disposed on a peripheral circuit region of the substrate and including a peripheral device isolation region defining a peripheral active region; a bit line structure and a bit line capping pattern stacked in order on the first lower structure; peripheral gate structures intersecting the peripheral active region and spaced apart from each other on the second lower structure; gate spacers on side surfaces of the peripheral gate structures; a peripheral interlayer insulating layer disposed on the second lower structure and covering the peripheral gate structures and the gate spacers; a peripheral contact plug penetrating through the peripheral interlayer insulating layer, electrically connected to a peripheral source/drain region in the peripheral active region, disposed between the peripheral gate structures and in contact with the gate spacers; and a peripheral interconnection line electrically connected to the peripheral contact plug and in contact with an upper surface of the peripheral interlayer insulating layer, wherein the peripheral gate structure includes a peripheral gate dielectric layer, a peripheral gate electrode, and a peripheral gate capping pattern stacked in order, wherein a lower end of the peripheral interlayer insulating layer is disposed at a level lower than a level of a lower surface of the peripheral gate electrode, wherein the bit line capping pattern includes a lower bit line capping layer and an upper bit line capping layer stacked in order, and wherein a material of the upper bit line capping layer is the same as a material of the peripheral interlayer insulating layer.

BRIEF DESCRIPTION OF DRAWINGS

The above and other aspects, features, and advantages of the present disclosure will be more clearly understood from the following detailed description, taken in combination with the accompanying drawings.

DETAILED DESCRIPTION

Hereinafter, example implementations are described as follows with reference to the accompanying drawings.

Figure 1:
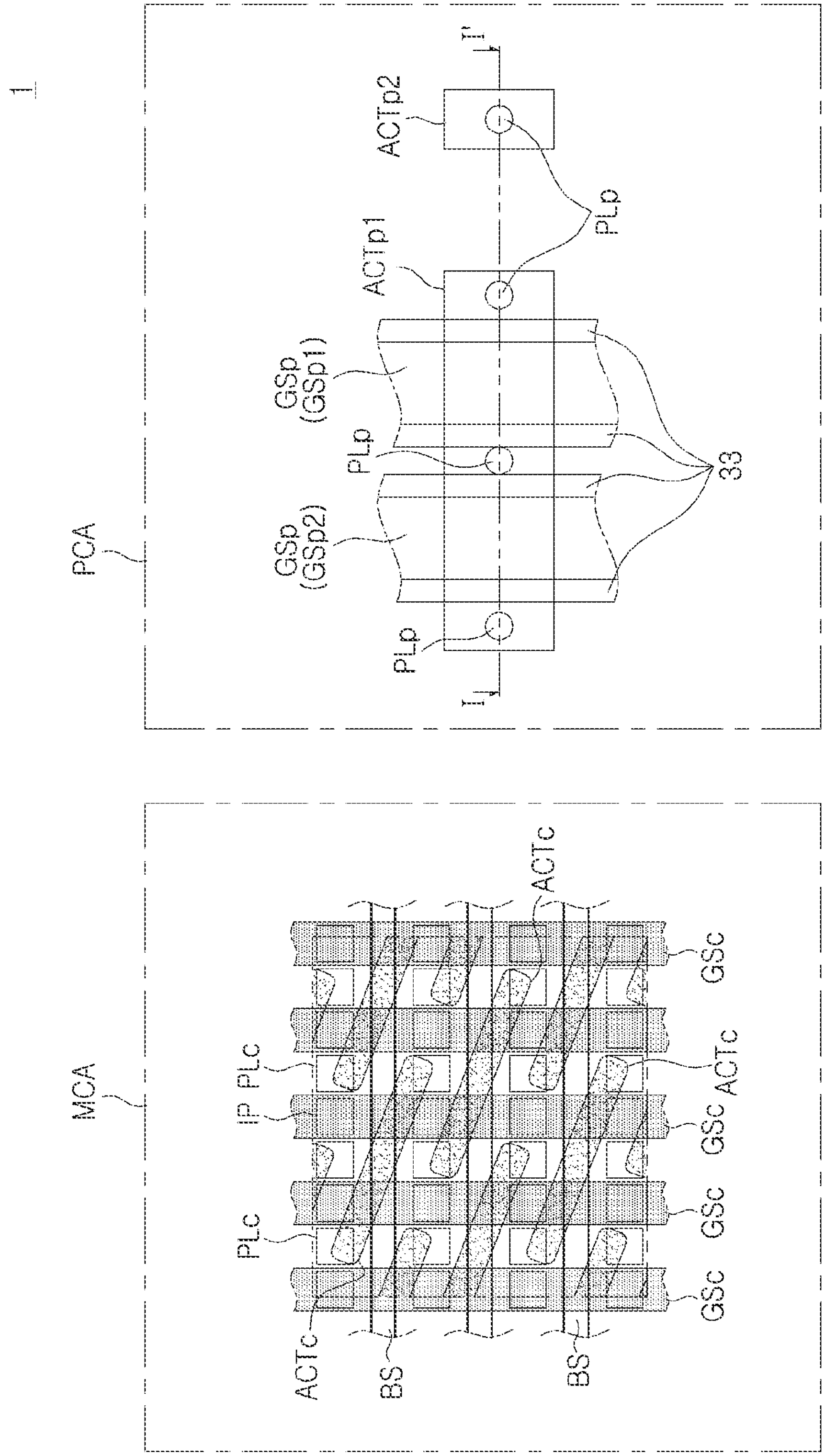
FIGS. 1, 2A, 2B, 3A, and 3B are example diagrams illustrating a semiconductor device.
Figure 2A:
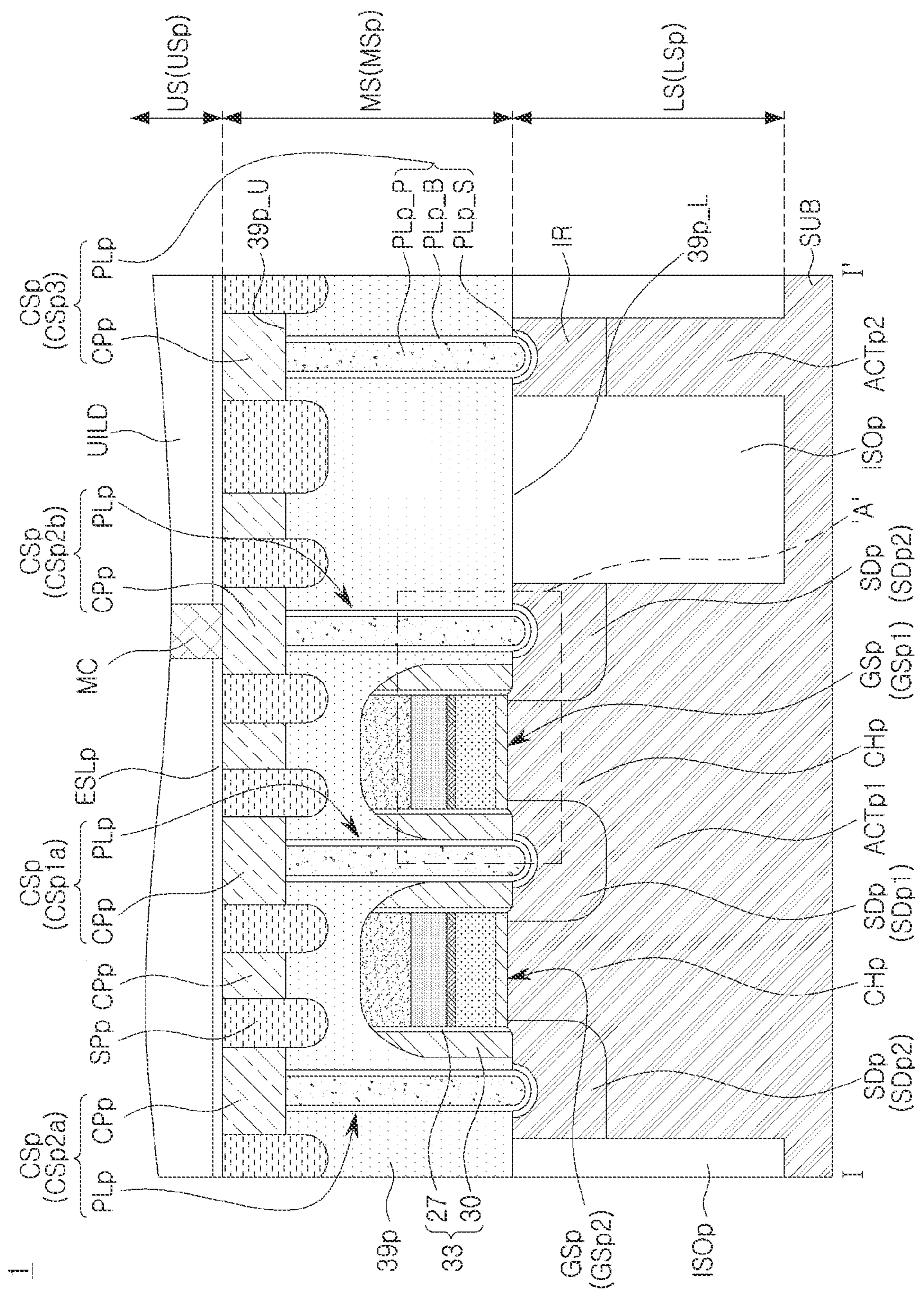
Figure 2B:
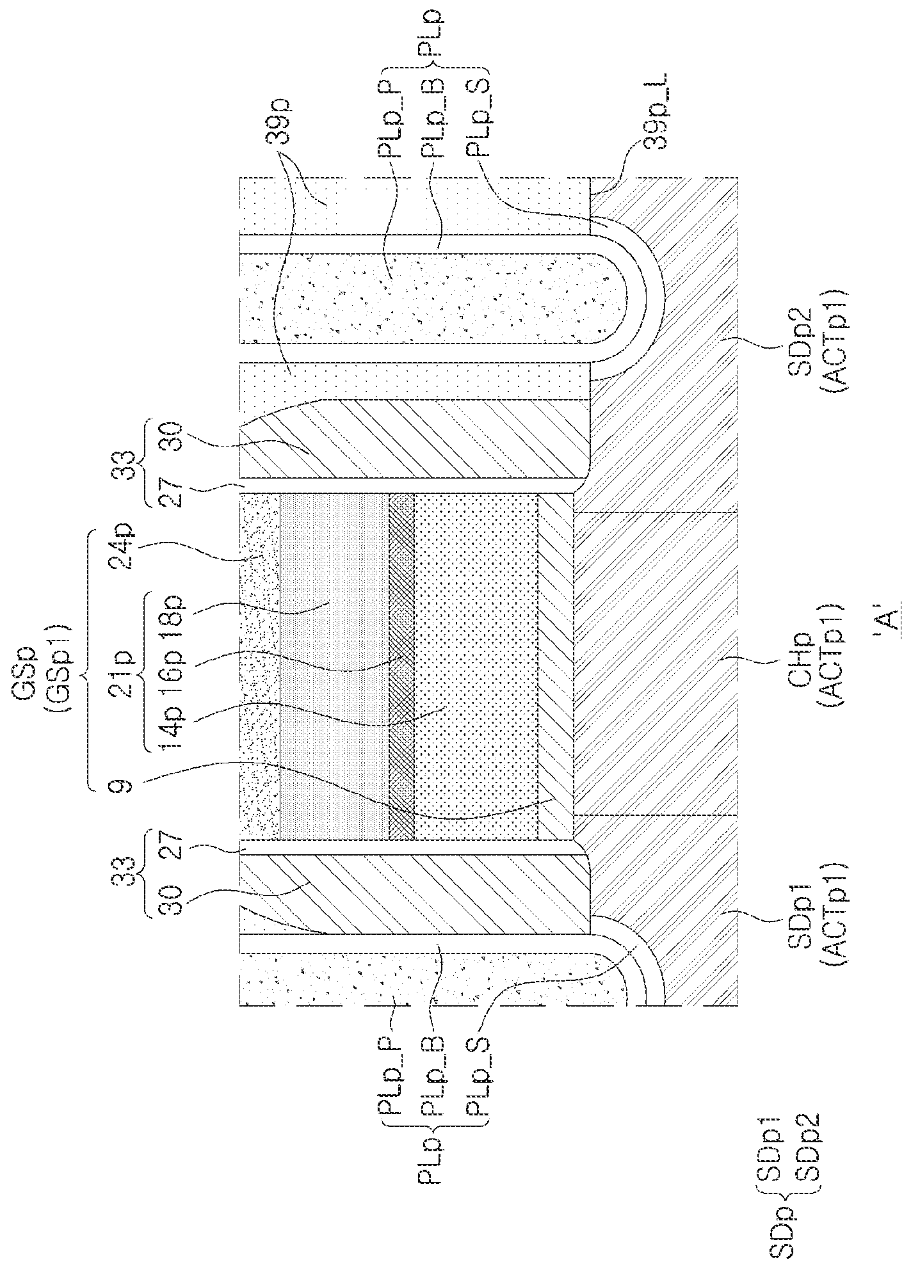
Figure 3A:
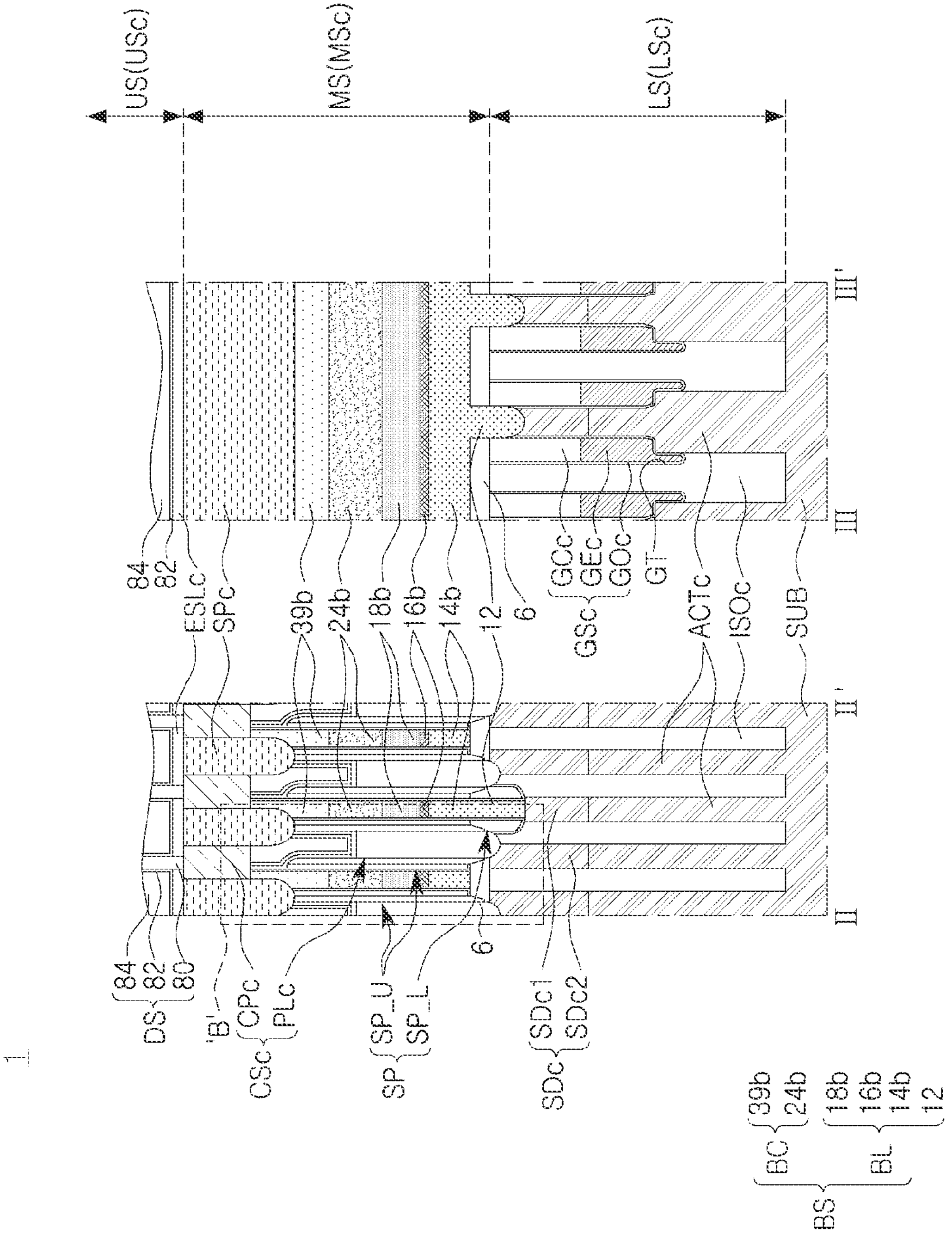
Figure 3B:
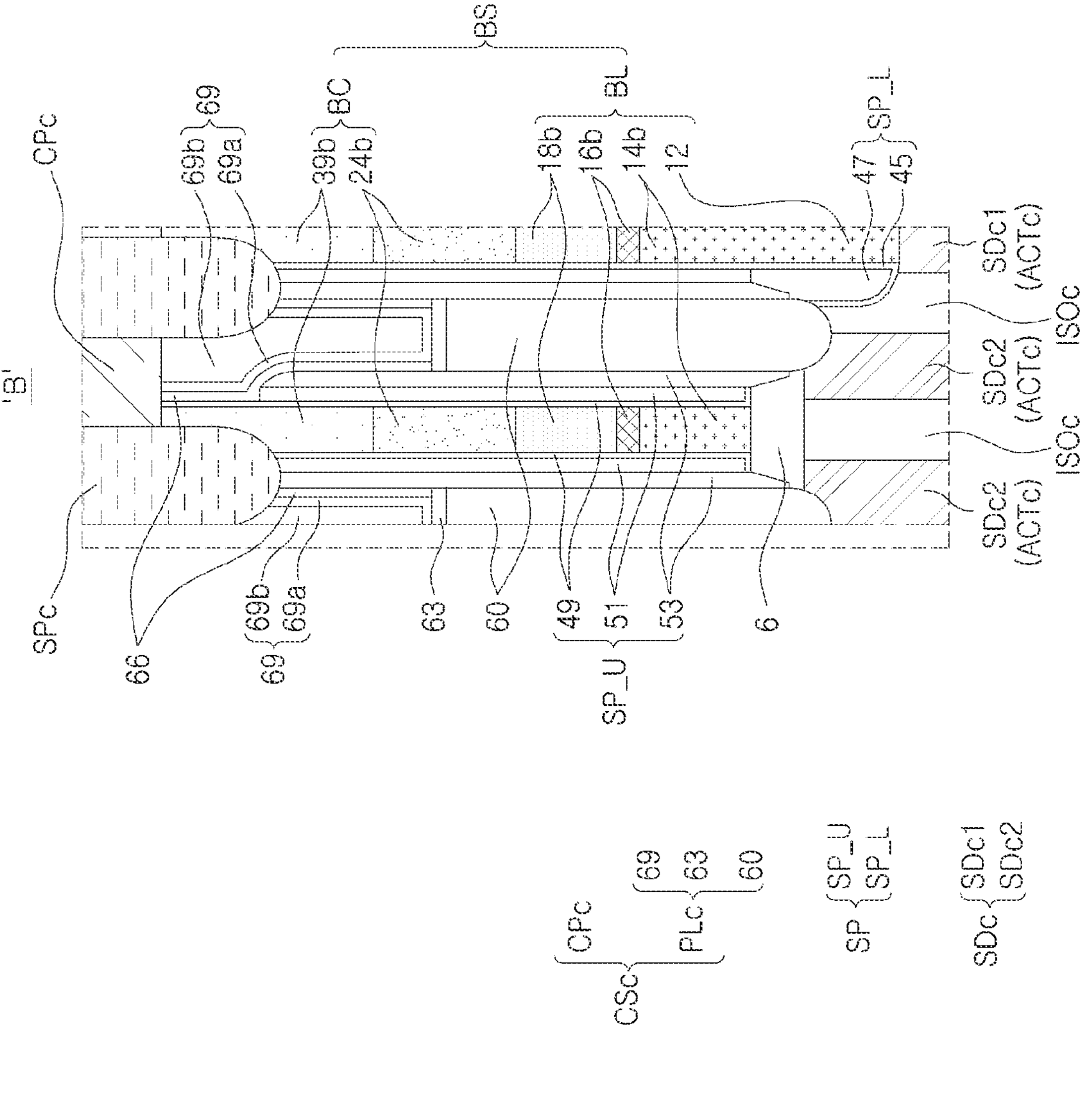

A semiconductor device according to an example implementation will be described with reference to FIGS. 1, 2A, 2B, 3A, and 3B. FIG. 1 is an example diagram illustrating a semiconductor device, viewed from the above. FIG. 2A is an example cross-sectional diagram illustrating a region taken along line I-I' in FIG. 1. FIG. 2B is an example enlarged diagram illustrating region "A" in FIG. 2A. FIG. 3A is an example cross-sectional diagram illustrating a region taken along line II-II' in FIG. 1. FIG. 3B is an example enlarged diagram illustrating region "B" in FIG. 3A.

Referring to FIGS. 1, 2A, 2B, 3A, and 3B, a semiconductor device 1 according to an example implementation may include a substrate SUB having a memory cell array region MCA and a peripheral circuit region PCA, a lower structure LS on the substrate SUB, an intermediate structure MS on the lower structure LS, and an upper structure US on the intermediate structure MS.

The substrate SUB may be configured as a semiconductor substrate. For example, the substrate SUB may include a semiconductor material, such as a group IV semiconductor, a group III-V compound semiconductor, or a group II-VI compound semiconductor. For example, the group IV semiconductor may include silicon, germanium, or silicon-germanium. The substrate SUB may be provided as a bulk semiconductor wafer, a semiconductor substrate including an epitaxial layer, a silicon on insulator (SOI) substrate, or a semiconductor on insulator (SeOI) substrate.

The lower structure LS may include a cell lower structure LSc on the memory cell array region MCA of the substrate SUB and a peripheral lower structure LSp on the peripheral circuit region PCA of the substrate SUB.

The intermediate structure MS may include a cell intermediate structure MSc on the cell lower structure LSc and a peripheral intermediate structure MSp on the peripheral lower structure LSp.

The upper structure US may include a cell upper structure USc on the cell intermediate structure MSc and a peripheral upper structure USp on the peripheral intermediate structure MSp.

First, with reference to FIGS. 1, 2A, and 2B, the peripheral lower structure LSp, the peripheral intermediate structure MSp and the peripheral upper structure USp disposed on the peripheral circuit region PCA of the substrate SUB will be described.

Referring to FIGS. 1, 2A, and 2B, the peripheral lower structure LSp may include a peripheral device isolation region ISOp defining a first peripheral active region ACTp1 and a second peripheral active region ACTp2.

Each of the first and second peripheral active regions ACTp1 and ACTp2 may protrude from the substrate SUB in a vertical direction. The peripheral device isolation region ISOp may be disposed on the substrate SUB and may be disposed on side surfaces of the first and second peripheral active regions ACTp1 and ACTp2. The peripheral device isolation region ISOp may be formed of an insulating material such as silicon oxide and/or silicon nitride.

The peripheral lower structure LSp may further include peripheral source/drain regions SDp and a peripheral channel region CHp disposed in an upper region of the first peripheral active region ACTp1. The peripheral channel region CHp may be disposed between the peripheral source/drain regions SDp. The peripheral source/drain regions SDp may include first peripheral source/drain regions SDp1 and second peripheral source/drain regions SDp2. In the implementations illustrated herein, the phrase source/drain regions may be understood to mean a source terminal region and/or a drain terminal region of a transistor.

The peripheral lower structure LSp may further include a peripheral impurity region IR disposed in an upper region of the second peripheral active region ACTp2.

The peripheral intermediate structure MSp may include peripheral gate structures GSp disposed on the first peripheral active region ACTp1, and peripheral gate spacers 33 on side surfaces of the peripheral gate structures GSp.

In an example implementation, the peripheral gate structures GSp may include a first peripheral gate structure GSp1 and a first peripheral gate structure GSp2 spaced apart from each other. The first and second peripheral gate structures GSp1 and GSp2 may intersect with the first peripheral active region ACTp1.

Each of the peripheral gate structures GSp may be disposed on the peripheral channel region CHp in the second peripheral active region ACTp1.

Each of the peripheral gate structures GSp may include a peripheral gate dielectric layer 9, a peripheral gate electrode 21*p*, and a peripheral gate capping layer 24*p* stacked in order.

The peripheral gate dielectric layer 9 may include at least one of silicon oxide and a high-κ dielectric. The high-κ dielectric may have a dielectric constant higher than a dielectric constant of silicon oxide. For example, the peripheral gate dielectric layer 9 may include silicon oxide, hafnium oxide (HfO), hafnium-based oxide (Hf-based oxide), aluminum oxide (AlO), aluminum-based oxide (Al-based oxide), lanthanum oxide (LaO), lanthanum-based oxide (La-based oxide), magnesium oxide (MgO), and magnesium oxide (Mg-based oxide).

The peripheral gate electrode 21*p* may include a first conductive layer 14*p*, a second conductive layer 16*p* and a third conductive layer 18*p* stacked in order. The first conductive layer 14*p* may include at least one conductive layer. For example, the first conductive layer 14*p* may include at least one of doped polysilicon, TiN, TiAl, TiAlC, TiAlN, TaN, TaAlC and TaAlN. The second conductive layer 16*p* may include a titanium silicon nitride (TiSiN) layer. The third conductive layer 18*p* may include a tungsten (W) layer.

The peripheral gate capping layer 24*p* may include an insulating material, for example, silicon nitride.

The peripheral gate spacers 33 may include at least one of silicon oxide and a low-κ dielectric. The low-κ dielectric may have a dielectric constant lower than that of silicon oxide.

Each of the peripheral gate spacers 33 may include at least two layers. For example, the peripheral gate spacers 33 may include an internal spacer 27 and an external spacer 30. The internal spacer 274 may be disposed between the external spacer 30 and the peripheral gate structure GSp.

On the first peripheral active region ACTp1, a lower end of the peripheral gate spacers 33 may be disposed at a level lower than a level of a lower end of the peripheral gate dielectric layer 9.

The peripheral intermediate structure MSp may further include a peripheral interlayer insulating layer 39*p*, peripheral conductive structures CSp and a peripheral insulating isolation pattern SPp.

The peripheral interlayer insulating layer 39*p* may be formed of silicon nitride and/or a silicon nitride-based insulating material.

The peripheral interlayer insulating layer 39*p* may be disposed on the first and second peripheral active regions ACTp1 and ACTp2 and the peripheral device isolation region ISOp, and may cover the peripheral gate structures GSp and the peripheral gate spacers 33.

The lower surface 39*p*_L of the peripheral interlayer insulating layer 39*p* may be disposed at a lower level than a level of a lower surface of the peripheral gate electrode 21*p*.

A lower surface 39*p*_L of the peripheral interlayer insulating layer 39*p* may be disposed at a level lower than a level of a lower surface of the peripheral gate dielectric layer 9.

An upper surface 39*p*_U of the peripheral interlayer insulating layer 39*p* may be disposed at a level higher than a level of upper surfaces of the peripheral gate structures GSp.

The peripheral conductive structures CSp may include first peripheral conductive structures CSp1 electrically connected to the first peripheral source/drain region SDp1, second peripheral conductive structures CSp2*a* and CSp2B electrically connected to the second peripheral source/drain regions SDp2, and a third peripheral conductive structure CSp3 electrically connected to the peripheral impurity region IR.

Each of the peripheral conductive structures CSp may include a peripheral contact plug PLp, and a peripheral interconnection line CPp.

In each of the peripheral conductive structures CSp, the peripheral contact plug PLp may penetrate through the peripheral interlayer insulating layer 39*p*. The peripheral contact plugs PLp of the peripheral conductive structures CSp may penetrate through the peripheral interlayer insulating layer 39*p* and may be connected to the first and second peripheral active regions ACTp1 and ACTp2.

An upper surface of the peripheral contact plug PLp may be coplanar with an upper surface of the first peripheral interlayer insulating layer 39*p*.

The peripheral contact plug PLp may include a metal-semiconductor compound layer PLp_S, a plug pattern PLp_P, and a conductive barrier layer PLp_B.

The metal-semiconductor compound layer PLp_S of the first and second peripheral conductive structures CSp1, CSp2*a* and CSp2B may be in contact with the peripheral source/drain regions SDp, and the metal-semiconductor compound layer of the third peripheral conductive structure CSp3 PLp_S may be in contact with the peripheral impurity region IR.

The plug pattern PLp_P may be disposed on the metal-semiconductor compound layer PLp_S. The conductive barrier layer PLp_B may be disposed on at least a side surface of the plug pattern PLp_P. The conductive barrier layer PLp_B may cover a side surface and a bottom surface of the plug pattern PLp_P.

The metal-semiconductor compound layer PLp_S may include a metal silicide, for example, at least one of WSi, TiSi, TaSi, NiSi and CoSi, and the conductive barrier layer PLp_B may include TiN, TaN, WN, TiSiN, or a mixture of TaSiN and RuTiN, and the plug pattern PLp_P may include a metal material such as tungsten.

In each of the peripheral conductive structures CSp, a lower surface of the peripheral interconnection line CPp may be in contact with an upper surface of the peripheral contact plug PLp and may be in contact with an upper surface of the peripheral interlayer insulating layer 39*p*. In each of the peripheral conductive structures CSp, a lower surface of the peripheral interconnection line CPp may be in contact with an upper surface of the plug pattern PLp_P and an upper end of the barrier layer PLp_B. The peripheral interconnection lines CPp may include a metal material such as tungsten.

The peripheral insulating isolation pattern SPp may be disposed between the peripheral interconnection lines CPp and may extend downwardly. The peripheral insulating isolation pattern SPp may be formed of an insulating material such as silicon nitride.

The peripheral upper structure USp may include a peripheral etch stop layer ESLp, an upper insulating layer UILD on the peripheral etch stop layer ESLp, and a peripheral contact structure MC penetrating through the upper insulating layer UILD and the peripheral etch stop layer ESLp and electrically connected to the peripheral interconnection line CPp.

In the description below, the cell lower structure LSc, the cell intermediate structure MSc and the cell upper structure USc disposed on the memory cell array region MCA of the substrate SUB will be described with reference to FIGS. 3A and 3B together with FIGS. 1, 2A, and 2B.

Referring to FIGS. 3A and 3B together with FIGS. 1, 2A, and 2B, the cell lower structure LSc may include a cell device isolation region ISOc defining a cell active region ACTc, and a cell gate structure GSc buried in the cell active region ACTc and extending into the cell device isolation region ISOc.

The cell active region ACTc may protrude from the substrate SUB in a vertical direction. The cell device isolation region ISOc may be disposed on the substrate SUB and may be disposed on a side surface of the cell active region ACTc. The cell device isolation region ISOc may be formed by shallow trench isolation. The device isolation region ISOc may be formed of an insulating material such as silicon oxide and/or silicon nitride.

Upper surfaces of the cell active region ACTc may be disposed at the same level as a level of upper surfaces of the first and second peripheral active regions ACTp1 and ACTp2.

The cell gate structure GSc may be disposed in a gate trench GT intersecting the cell active region ACTc and extending into the cell device isolation region ISOc.

Each of the cell gate structures GS may include a cell gate dielectric layer GOc conformally covering an internal wall of the gate trench GT, a cell gate electrode GEc partially filling the gate trench GT on the cell gate dielectric layer GOc, and a cell gate capping layer GCc on the cell gate electrode GEc.

The cell gate dielectric layer GOc may include at least one of silicon oxide and a high-κ dielectric. The cell gate electrode GEc may include doped polysilicon, metal, conductive metal nitride, and metal-semiconductor compound, conductive metal oxide, graphene, carbon nanotube, or a combination thereof. For example, the cell gate electrode GEc may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotube or a combination thereof, but an example implementation thereof is not limited thereto. The cell gate electrode GEc may include a single layer or multiple layers formed of the above materials. For example, the cell gate electrode GEc may include a second electrode layer formed of a metal material and a first electrode layer formed of doped polysilicon on the first electrode layer. The cell gate capping pattern GCc may include an insulating material, for example, silicon nitride.

The cell lower structure LSc may further include cell source/drain regions SDc including a first cell impurity region SDc1 and a second cell impurity region SDc2 disposed in the cell active region ACTc.

The cell gate dielectric layer GOc, the cell gate electrode GEc, and the cell source/drain regions SDc may form cell transistors.

The cell intermediate structure MSc may include a buffer layer 6, wiring structures BS, cell spacers SP, cell contact structures CSc, pad patterns CPc, and a cell insulating isolation pattern SPc.

The buffer layer 6 may be disposed on the cell lower structure LSc. The buffer layer 6 may include a plurality of insulating layers stacked in order. For example, the buffer layer 6 may include at least two material layers, for example a silicon oxide layer and a silicon nitride layer.

Each of the wiring structures BS may include a bit line structure BL and a bit line capping pattern BC on the bit line structure BL.

The bit line structure BL may include doped polysilicon, metal, conductive metal nitride, a metal-semiconductor compound, a metal compound, conductive metal oxide, graphene, carbon nanotube, or a combination thereof. For example, the bit lines BL may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotubes or a combination thereof, but an example implementation thereof is not limited thereto.

The bit line structure BL may include a plug portion 12 penetrating through the buffer insulating layer 6 and electrically connected to the first impurity region SDc1, and line portions 14*b*, 16*b*, and 18*b* disposed on the buffer insulating layer 6 and connected to the plug portion 12.

In example implementations, when the semiconductor device 1 is implemented as a memory device, the cell gate electrode GEc may be configured as a word line, and the line portions 14*b*, 16*b*, and 18*b* may be configured as a bit line. The line portions 14*b*, 16*b*, and 18*b* may be referred to as conductive line patterns or wiring patterns.

The plug portion 12 may include doped silicon, for example, doped polysilicon.

The line portions 14*b*, 16*b*, and 18*b* may include a first conductive layer 14*p*, a second conductive layer 16*p*, and a third conductive layer 18*p* stacked in order.

The first conductive layer 14*p* may include doped polysilicon, for example, polysilicon having N-type conductivity. The second conductive layer 16*p* may include at least one of a metal-semiconductor compound layer and a conductive barrier layer. For example, the metal-semiconductor compound layer may include at least one of a metal silicide such as WSi, TiSi, TaSi, NiSi and CoSi, and the conductive barrier layer may include at least one of TiN, TaN, WN, TiSiN, TaSiN and RuTiN. The third conductive layer 18*p* may include a metal material such as W.

The bit line capping pattern BC may include a lower bit line capping layer 24B and an upper bit line capping layer 39*b* stacked in order. The lower bit line capping layer 24B may be formed of silicon nitride and/or a silicon nitride-based insulating material. The upper bit line capping layer 39*b* may be formed of silicon nitride and/or a silicon nitride-based insulating material.

A material of the lower bit line capping layer 24B may be formed by the same process of forming a material of the peripheral gate capping layer 24*p*. Accordingly, the lower bit line capping layer 24B and the peripheral gate capping layer 24*p* may include the same insulating material. An upper surface of the lower bit line capping layer 24B may be coplanar with an upper surface of the peripheral gate capping layer 24*p*. A thickness of the lower bit line capping layer 24B may be substantially the same as a thickness of the peripheral gate capping layer 24*p*.

A material of the upper bit line capping layer 39*b* may be formed by the same process of forming a material of the peripheral interlayer insulating layer 39*p*. Accordingly, the upper bit line capping layer 39*b* and the peripheral interlayer insulating layer 39*p* may include the same insulating material. An upper surface of the upper bit line capping layer 39*b* may be coplanar with an upper surface of the peripheral interlayer insulating layer 39*p*.

The spacer structures SP may be disposed on side surfaces of the wiring structures BS. Each of the spacer structures SP may include a lower spacer SP_L and an upper spacer SP_U.

The lower spacer SP_L may be disposed on a side surface of the plug portion 12.

The upper spacer SP_L may be disposed on side surfaces of the line portions 14*b*, 16*b*, and 18*b* and the bit line capping pattern BC.

The upper spacer SP_L may include an internal spacer 49, an external spacer 53 and an air gap 51 between the internal spacer 49 and the external spacer 53. At least one of the internal spacer 49 and the external spacer 53 may include at least one of SiN, SiCN, SiON and SiOCN.

The lower spacer SP_L may be disposed below the upper spacer SP_L. The lower spacer SP_L may include a first lower spacer layer 45 and a second lower spacer layer 47. The first lower spacer layer 45 may cover a side surface and a lower surface of the second lower spacer layer 47. The first lower spacer layer 45 may extend from the internal spacer 49. Accordingly, the first lower spacer layer 45 and the internal spacer 49 may be formed of the same material. The second lower spacer layer 47 may include at least one of SiN and SiCN.

Each of the cell contact structures CSc may include a cell contact plug PLc and a cell contact pad CPc on the cell contact plug PLc.

The cell contact plug PLc may include a lower portion 60 electrically connected to the second impurity region SDc2, an intermediate portion 63 on the lower portion 60, and an upper portion 69 on the intermediate portion 63.

The lower portion 59 may be formed of doped polysilicon, for example, polysilicon having N-type conductivity. The intermediate portion 63 may include a metal-semiconductor compound layer. For example, the metal-semiconductor compound layer may include at least one of WSi, TiSi, TaSi, NiSi and CoSi. The upper portion 69 may include a barrier layer 69*a* and a conductive pattern 69*b* on the barrier layer 69*a*. The barrier layer 69*a* may include at least one of TiN, TaN, WN, TiSiN, TaSiN, or RuTiN, and the conductive pattern 69*b* may include a metal material such as W. The barrier layer 69*a* may cover a side surface and a lower surface of the conductive pattern 69*b*.

The cell intermediate structure MSc may further include a contact spacer 66 surrounding a side surface of the upper portion 69. The contact spacer 66 may include an insulating material such as silicon oxide.

The cell contact pad CPc may be connected to an upper surface of the cell contact plug PLc and may cover a portion of an upper surface of the adjacent bit line capping pattern BC. The cell contact pad CPc may include a conductive material such as tungsten.

The insulating fences (IP in FIG. 1) may be disposed between the wiring structures BS and between the cell contact plugs PLc. The insulating fences (IP in FIG. 1) may be formed of an insulating material such as silicon nitride.

The cell insulating isolation pattern SPc may surround side surfaces of the cell pad patterns CPc and may extend downwardly. The cell insulating isolation pattern SPc may seal an upper portion of the air gap 51 of the cell spacers SP. The cell insulating isolation pattern SPc may include an insulating material such as silicon nitride. Upper surfaces of the insulating isolation pattern SPc may be coplanar with upper surfaces of the cell pad patterns CPc.

The cell upper structure USc may include a cell etch stop layer ESLc and a data storage structure DS. The cell etch stop layer ESLc may be disposed on the insulating isolation pattern SPc and the cell pad patterns CPc, and may be formed of an insulating material.

In an example, the data storage structure DS may be configured as a capacitor for storing data in DRAM. For example, the data storage structure DS may be implemented as a capacitor of DRAM including first electrodes 80 penetrating through the cell etch stop layer ESLc and electrically connected to the pad patterns CPc, a dielectric layer 82 covering the first electrode 80 and the etch stop layer ESLc, and a second electrode 84 on the dielectric layer 82. The dielectric layer 82 may include a high-κ dielectric, silicon oxide, silicon nitride, silicon oxynitride, or a combination thereof.

In another example, the data storage structure DS may be configured as a structure for storing DRAM and other memory data. For example, the data storage structure DS may be configured as a capacitor of a ferroelectric memory (FeRAM) disposed between the first and second electrodes 80 and 84 and including a dielectric layer 82 including a ferroelectric layer. For example, the dielectric layer 82 may include a ferroelectric layer for recording data using a polarization state.

Figure 4:
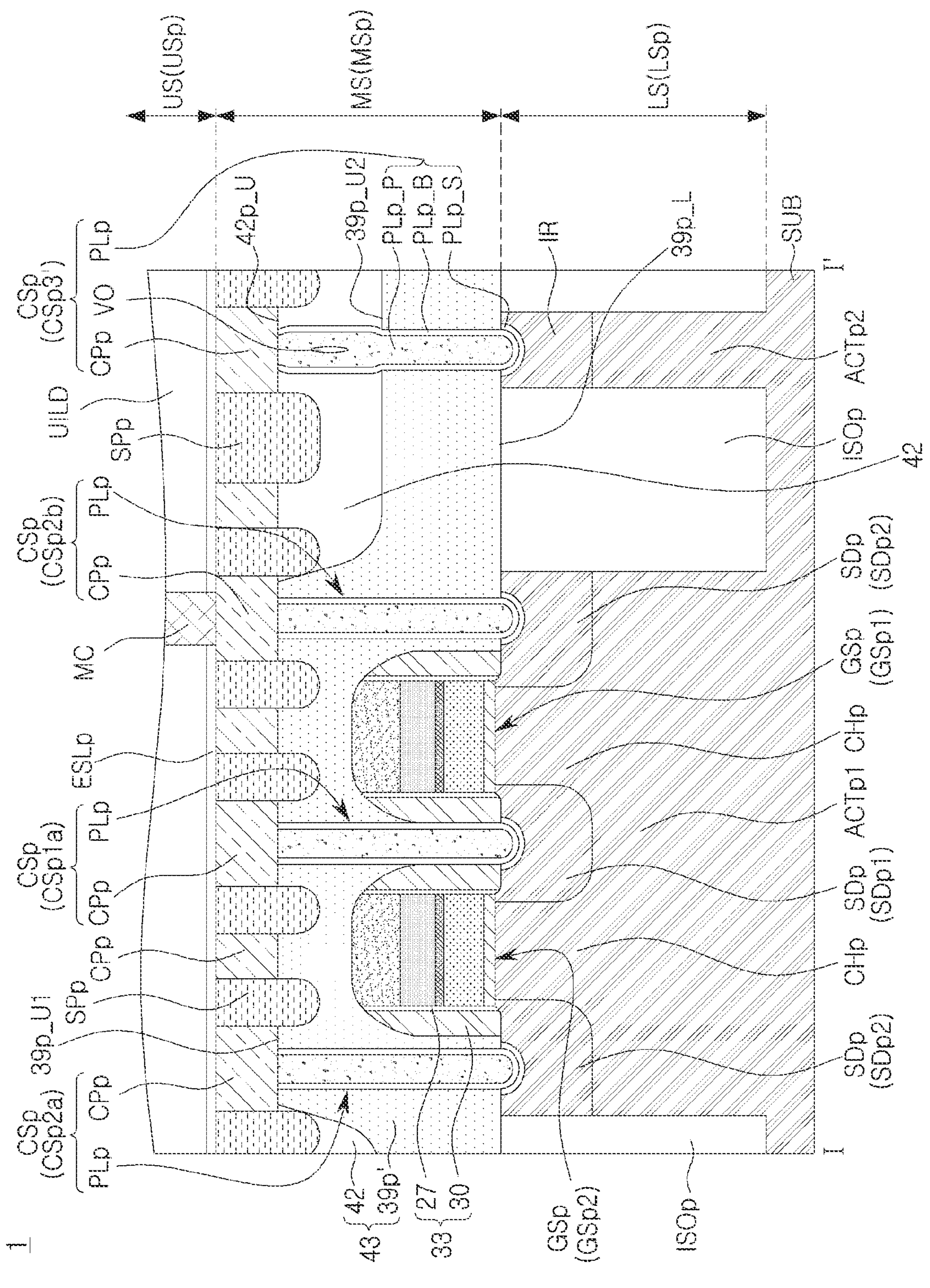
FIG. 4 is a cross-sectional diagram illustrating a modified example of a portion of components of a semiconductor device.
Figure 5A:
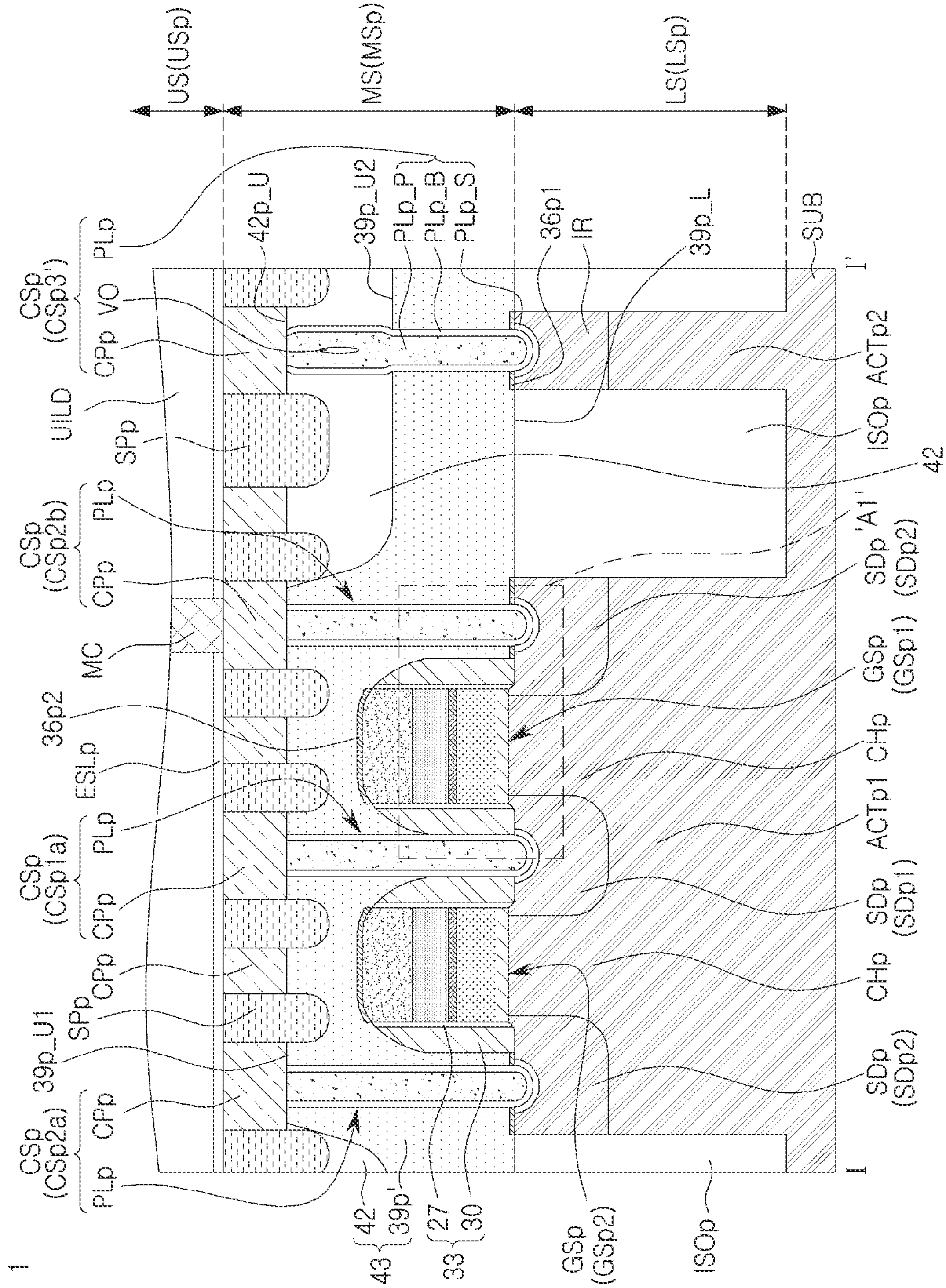
FIGS. 5A, 5B, and 6 are diagrams illustrating another modified example of a portion of components of a semiconductor device.
Figure 5B:
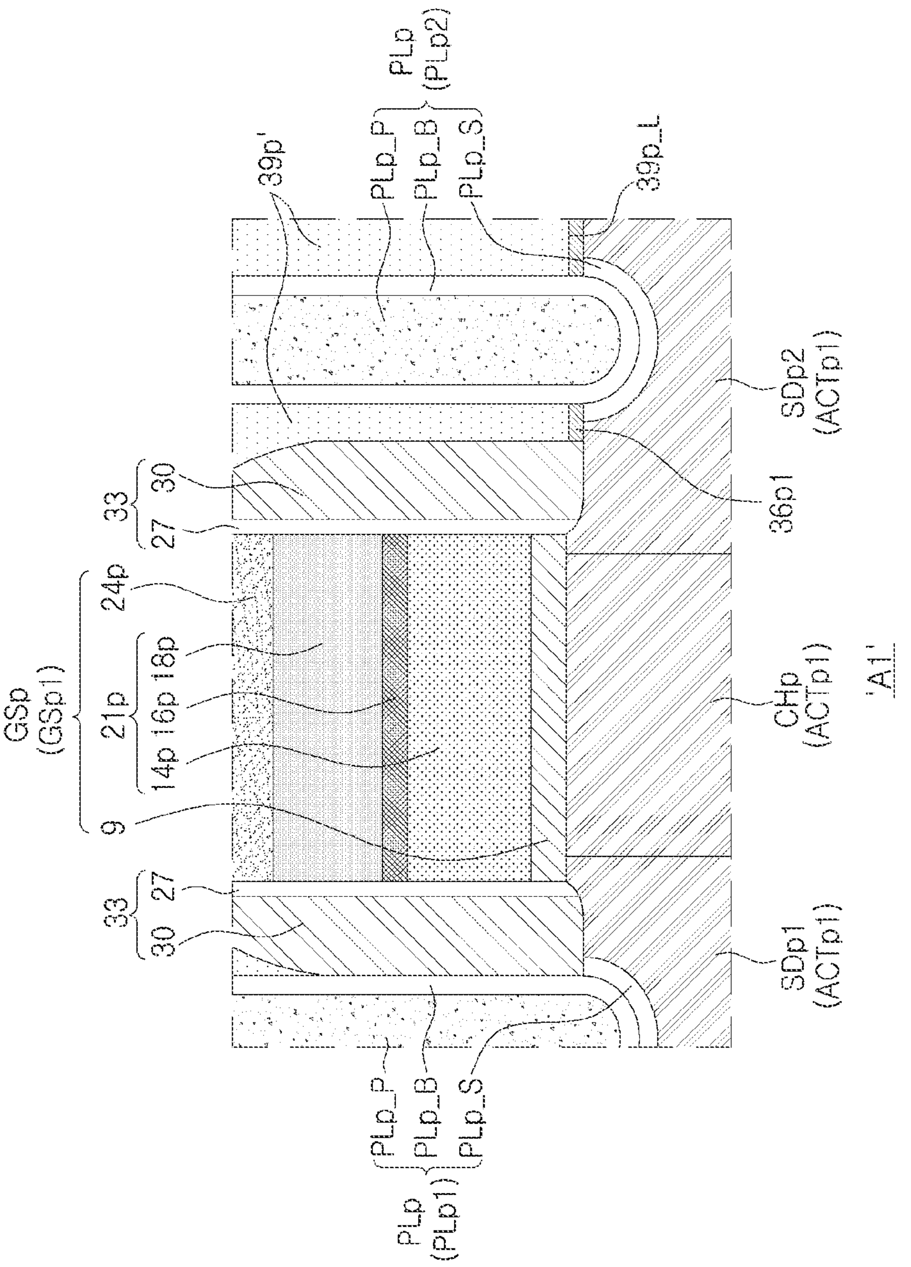
Figure 6:
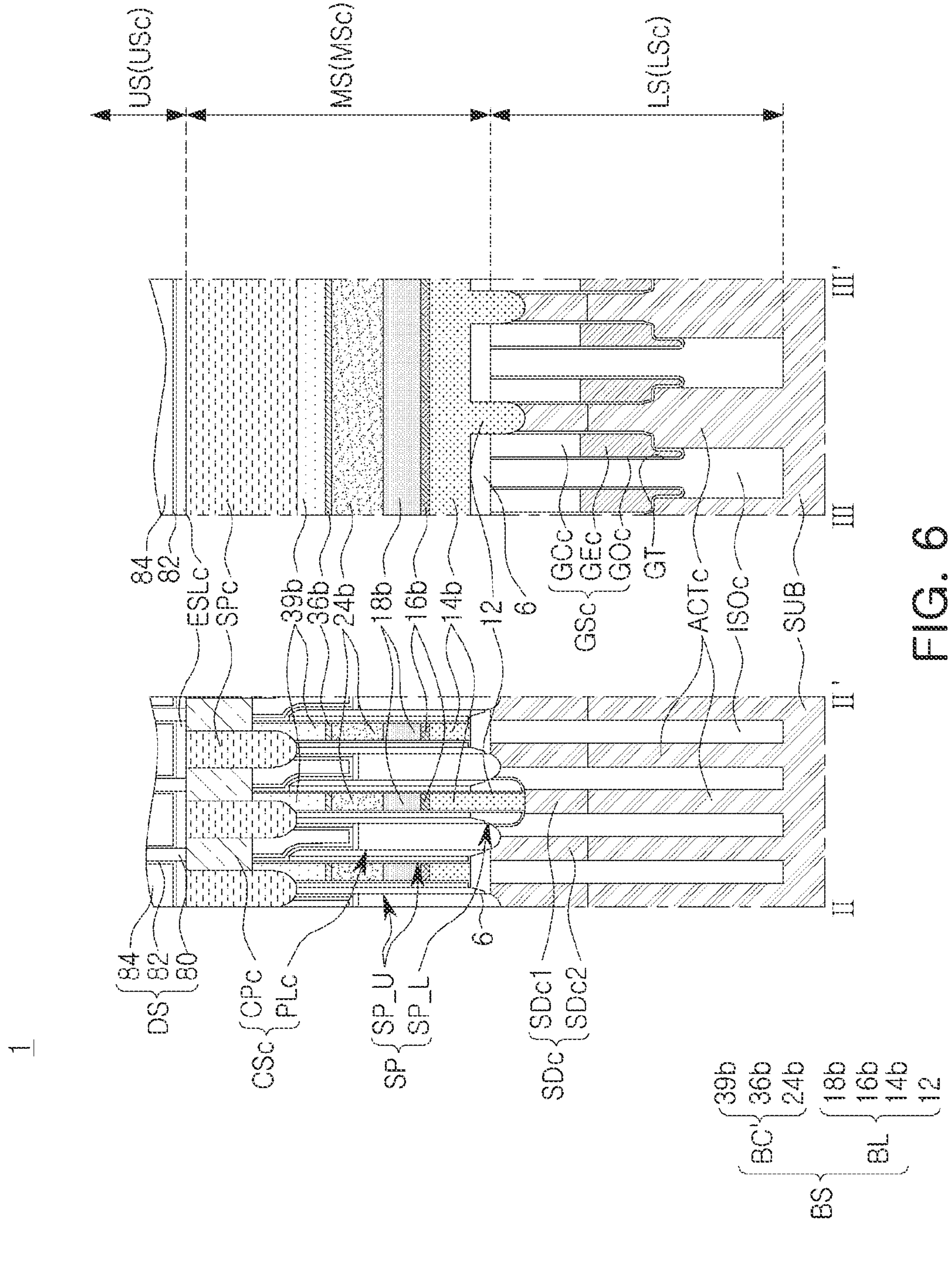
Figure 7:
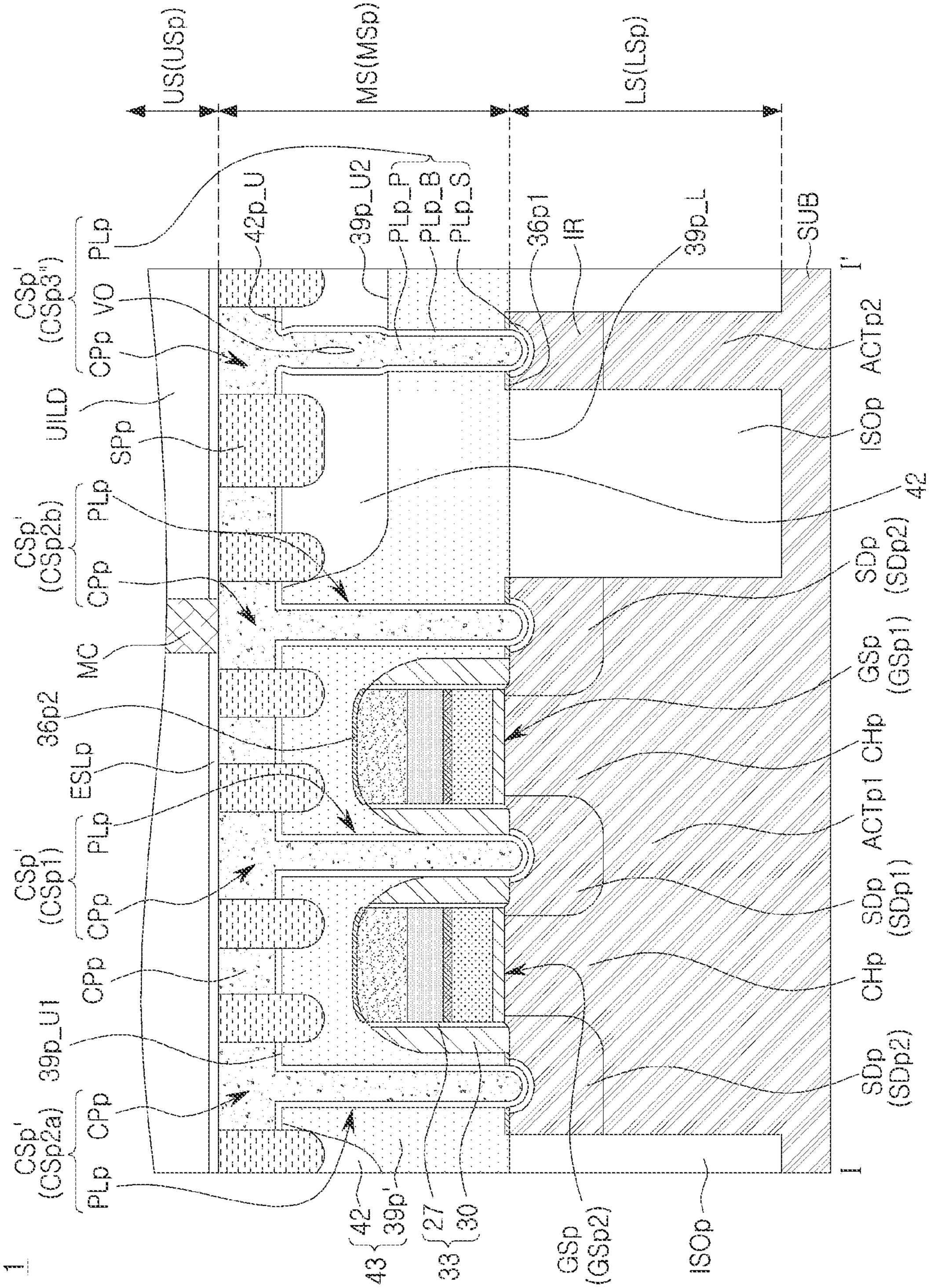
FIGS. 7, 8A, and 8B are diagrams illustrating another modified example of a portion of components of a semiconductor device.
Figure 8A:
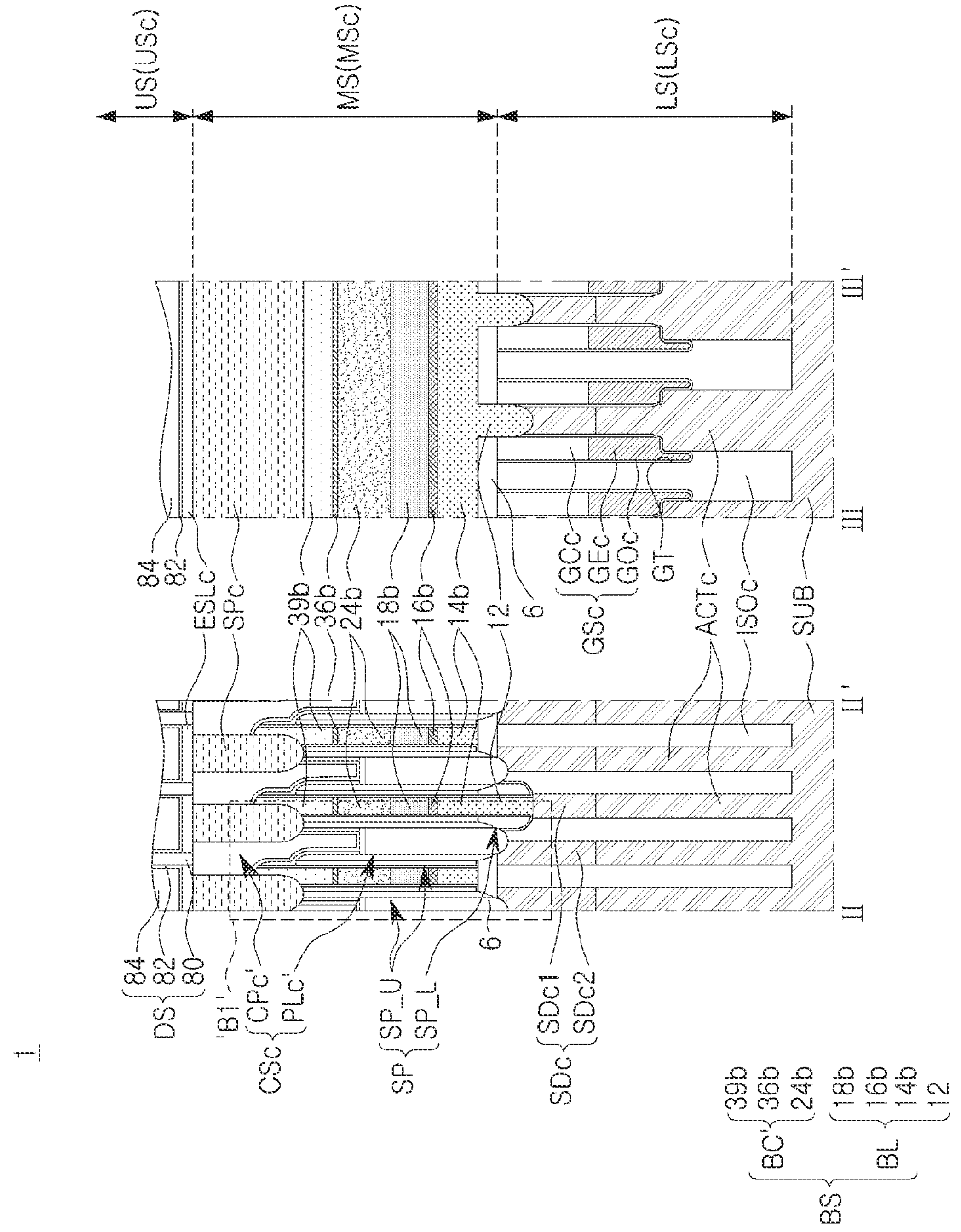
Figure 8B:
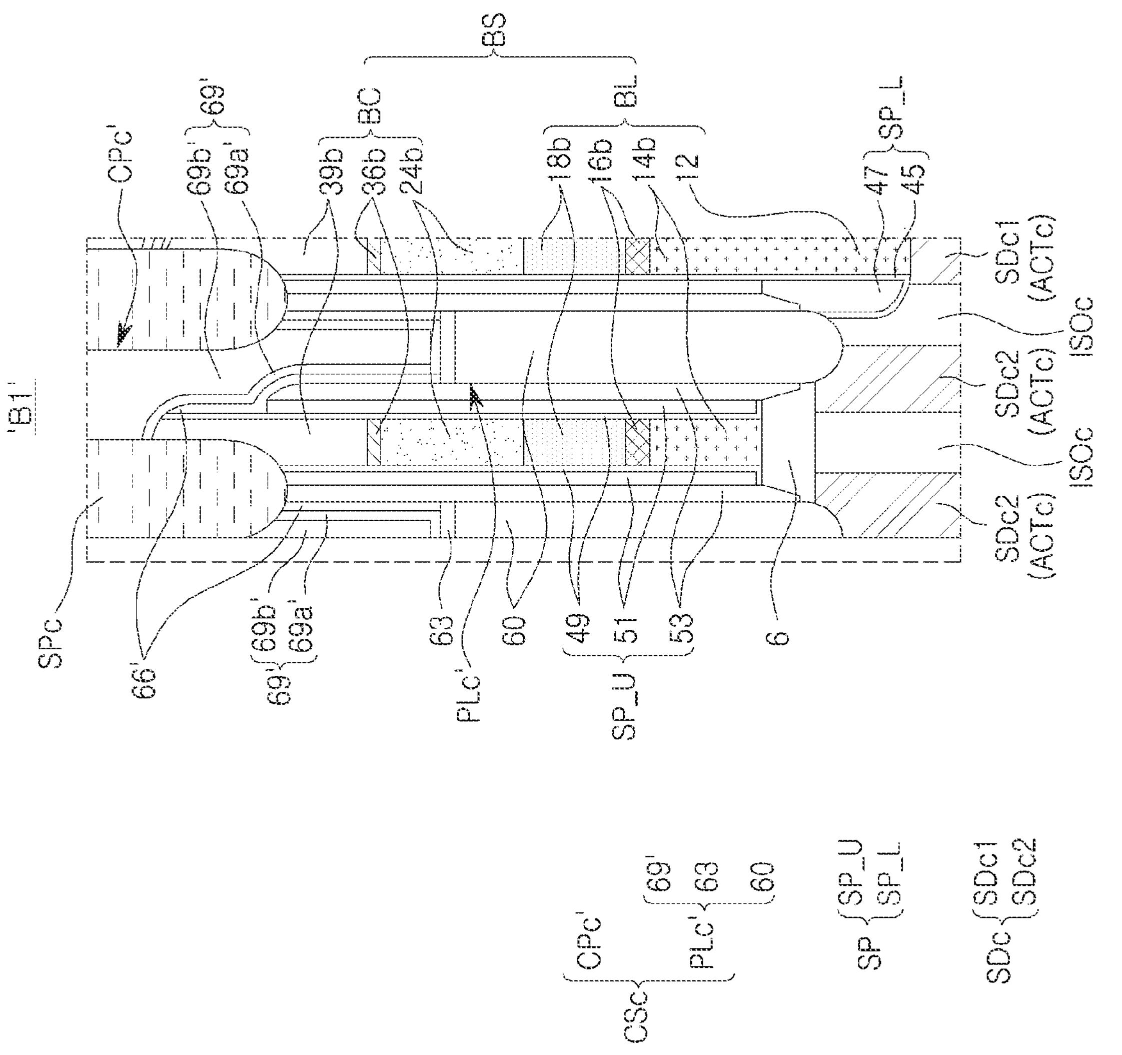
Figure 9:
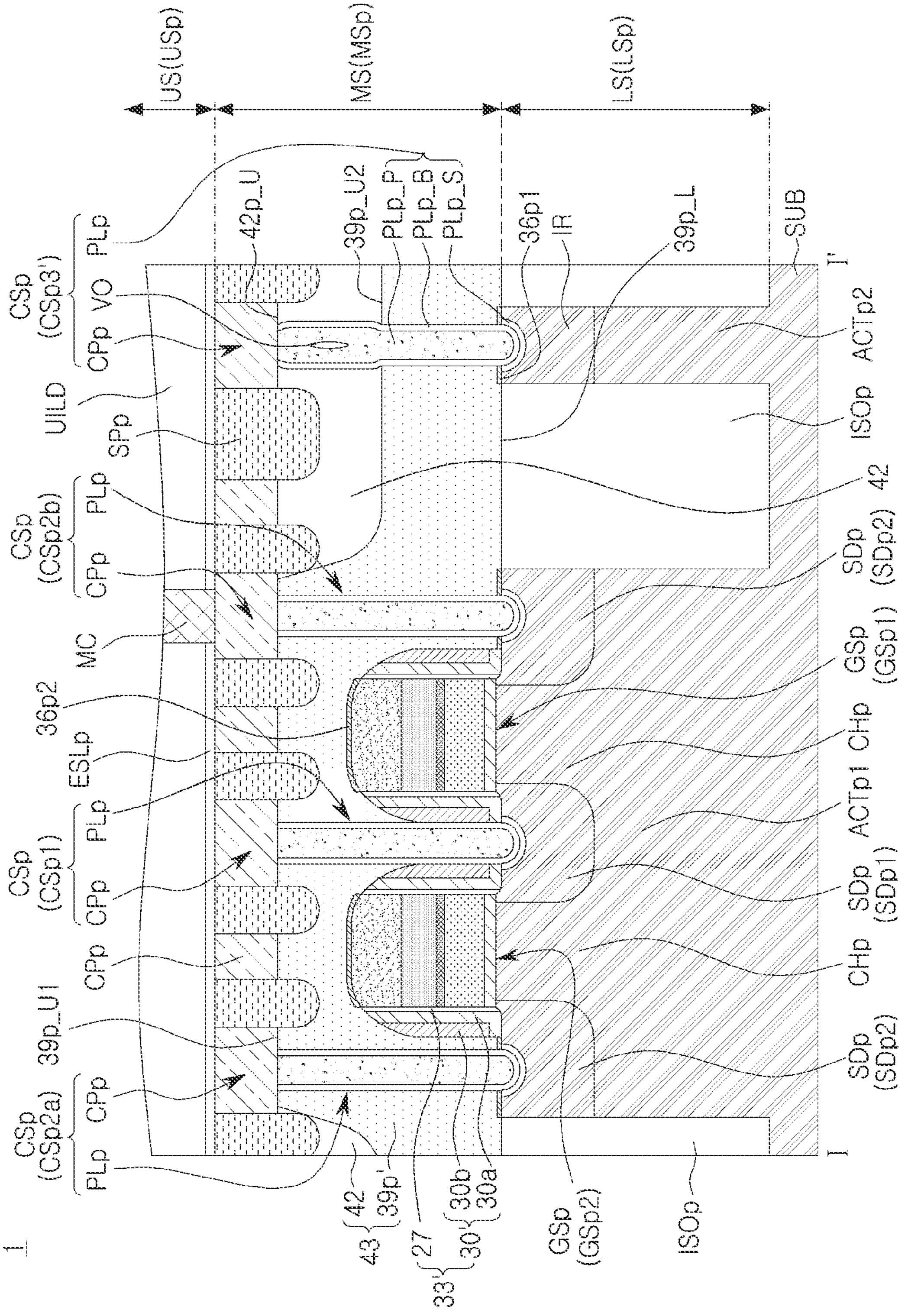
FIG. 9 is a cross-sectional diagram illustrating another modified example of a portion of components of a semiconductor device.

Hereinafter, various modified examples of the components of the above-described example implementation will be described with reference to FIGS. 4 to 9. FIG. 4 is a cross-sectional diagram illustrating a region taken along line I-I' in FIG. 1, illustrating a modified example of a portion of components of a semiconductor device. FIGS. 5A, 5B, and 6 are diagrams illustrating another modified example of a portion of components of a semiconductor device. FIG. 5A is a cross-sectional diagram illustrating a region taken along line I-I' in FIG. 1. FIG. 5B is an enlarged diagram of illustrating a region "AI" in FIG. 5A, and FIG. 6 is a cross-sectional diagram illustrating a region taken along line II-II' in FIG. 1. FIGS. 7, 8A, and 8B are diagrams illustrating another modified example of a portion of components of a semiconductor device. FIG. 7 is a cross-sectional diagram illustrating a region taken along line I-I' in FIG. 1. FIG. 8A is a cross-sectional diagram illustrating a region taken along line II-II' in FIG. 1, and FIG. 8B is an enlarged diagram illustrating region "B1" in FIG. 8A. FIG. 9 is a cross-sectional diagram illustrating a region taken along line II-II' in FIG. 1, illustrating another modified example of a portion of components of a semiconductor device.

Various modified examples of the components in the above-described example implementation described below will be described with modified or replaced components. Here, the components described above may be directly referred to without a detailed explanation, or the description may not be provided. Also, components which may be modified or replaced will be described with reference to the drawings, but the components which may be modified or replaced may be combined with each other or with the components described above and may be included in a semiconductor device in an example implementation.

In a modified example, referring to FIG. 4, the peripheral interlayer insulating layer 39 in FIG. 2A may be replaced with a peripheral interlayer insulating layer 43 including a first peripheral interlayer insulating layer 39*p*' having a first upper surface 39*p*_U1 and a second upper surface 39*p*_U2 disposed on different height levels and a second peripheral interlayer insulating layer 42 on the second upper surface 39*p*_U2 of the first peripheral interlayer insulating layer 39*p'*.

A material of the first peripheral interlayer insulating layer 39' may be the same as a material of the peripheral interlayer insulating layer (39 in FIG. 2) in FIG. 2A.

A material of the second peripheral interlayer insulating layer 42 may be different from a material of the first peripheral interlayer insulating layer 39'. For example, the second peripheral interlayer insulating layer 42 may include silicon oxide or a low-κ dielectric, and the first peripheral interlayer insulating layer 39' may include silicon nitride.

The second peripheral interlayer insulating layer 42 may prevent deformation such as warpage of the semiconductor device 1.

In the first peripheral interlayer insulating layer 39', the second upper surface 39*p*_U2 may be disposed at a level lower than a level of the first upper surface 39*p*_U1.

The second peripheral interlayer insulating layer 42 may be in contact with the second upper surface 39*p*_U2 of the first peripheral interlayer insulating layer 39'.

The upper surface 42*p*_U of the second peripheral interlayer insulating layer 42 may be coplanar with the first upper surface 39*p*_U1 of the first peripheral interlayer insulating layer 39'.

The third peripheral conductive structure CSp3 described above may be modified to form a third peripheral conductive structure CSp3' including a peripheral contact plug PLp penetrating through the first and second peripheral interlayer insulating layers 39' and 42.

Among the peripheral conductive structures CSp, the peripheral contact plugs PLp of the first and second peripheral conductive structures CSp1, CSp2*a*, and CSp2B may penetrate through the first peripheral interlayer insulating layer 39', and the peripheral contact plug PLp of the third peripheral conductive structure CSp3' may penetrate through the first and second peripheral interlayer insulating layers 39' and 42.

The peripheral contact plugs PLp of the first and second peripheral conductive structures CSp1, CSp2*a*, and CSp2B may be spaced apart from the second peripheral interlayer insulating layer 42.

In the peripheral contact plug PLp of the third peripheral conductive structure CSp3, an upper portion penetrating through the second peripheral interlayer insulating layer 42 may have a width larger than that of a lower portion penetrating through the first peripheral interlayer insulating layer 39'.

The width of the upper portion penetrating through the second peripheral interlayer insulating layer 42 of the peripheral contact plug PLp of the third peripheral conductive structure CSp3 may be greater than a width of each of the peripheral contact plugs PLp of the first and second peripheral conductive structures CSp1, CSp2*a*, and CSp2B at the same level as a level of the second peripheral interlayer insulating layer 42.

A side surface of the peripheral contact plug PLp of the third peripheral conductive structure CSp3 may have a bent portion between a side surface of the upper portion and a side surface of the lower portion.

The peripheral contact plug PLp of the third peripheral conductive structure CSp3 may include a void VO in the upper portion.

Among the peripheral conductive structures CSp, lower surfaces of the peripheral interconnection lines CPp of the first and second peripheral conductive structures CSp1, CSp2*a*, and CSp2B may be in contact with the upper surface of the first peripheral interlayer insulating layer 39', and a lower surface of the peripheral interconnection line CPp of the third peripheral conductive structure CSp3 may be in contact with an upper surface of the second peripheral interlayer insulating layer 42.

In the modified examples in FIGS. 5A, 7 and 9 below, the peripheral interlayer insulating layer (39 in FIG. 2A) in FIG. 2A may be replaced with the peripheral interlayer insulating layer (43 in FIG. 4) in FIG. 4, but in the modified examples in FIGS. 5A, 7 and 9, the peripheral interlayer insulating layer (43 in FIG. 4) may be replaced with the peripheral interlayer insulating layer (39 in FIG. 2A) in FIG. 2A.

In a modified example, referring to FIGS. 5A, 5B, and 6, the semiconductor device 1 may further include a first buffer insulating layer 36*p*1 between upper surfaces of the first and second peripheral active regions ACTp1 and ACTp2 and the first peripheral interlayer insulating layer 39'.

The first buffer insulating layer 36*p*1 may be formed of an oxide formed by oxidizing surfaces of the first and second peripheral active regions ACTp1 and ACTp2. For example, the first buffer insulating layer 36*p*1 may include silicon oxide.

The lower surface 39*p*_L of the first peripheral interlayer insulating layer 39' may be disposed at a lower level than a level of the lower surface of the peripheral gate electrode 21*p*.

The peripheral contact plugs PLp may penetrate through the peripheral interlayer insulating layer 43 and the first buffer insulating layer 36*p*1 and may be connected to the first and second peripheral active regions ACTp1 and ACTp2.

The semiconductor device 1 may further include a second buffer insulating layer 36*p*2 between the peripheral gate capping layer 24*p* and the first peripheral interlayer insulating layer 39'.

The second buffer insulating layer 36*p*2 may include an oxide of a material of the first peripheral interlayer insulating layer 39', for example, SiON.

Each of the first and second buffer insulating layers 36*p*1 and 36*p*2 may have a thickness smaller than that of the peripheral gate dielectric layer 9.

Each of the first and second buffer insulating layers 36*p*1 and 36*p*2 may have a thickness of about 20 Å or less.

Each of the first and second buffer insulating layers 36*p*1 and 36*p*2 may have a thickness of about 15 Å or less.

The semiconductor device 1 may further include a third buffer insulating layer 36*b* between the upper bit line capping layer 39*b* and the lower bit line capping layer 24B. The third buffer insulating layer 36*b* may also be referred to as a buffer capping layer.

A material of the third buffer insulating layer 36*b* may be the same as that of the second buffer insulating layer 36*p*2.

A thickness of the third buffer insulating layer 36*b* may be substantially the same as a thickness of the second buffer insulating layer 36*p*2.

The first to third buffer insulating layers 36*p*1, 36*p*2, and 36*b* may reduce stress of the semiconductor device 1. Accordingly, the first to third buffer insulating layers 36*p*1, 36*p*2, and 36*b* may improve reliability and durability of the semiconductor device 1.

In the modified example, referring to FIGS. 7, 8A and 8B, the peripheral conductive structures CSp in FIGS. 2A, 4, and 5A may be replaced with peripheral conductive structures CSp' illustrated in FIG. 7.

Each of the peripheral conductive structures CSp' may include a peripheral contact plug PLp and a peripheral interconnection line CPp extending from the peripheral contact plug PLp.

In each of the peripheral conductive structures CSp', the peripheral contact plug PLp may penetrate through the peripheral interlayer insulating layer 43, the peripheral interconnection line CPp may extend from the peripheral contact plug PLp, and may have a lower surface covering an upper surface of the peripheral interlayer insulating layer 43.

In each of the peripheral conductive structures CSp', the peripheral contact plug PLp may include the metal-semiconductor compound layer PLp_S, the plug pattern PLp_P on the metal-semiconductor compound layer PLp_S, and the conductive barrier layer PLp_B covering side and bottom surfaces of the plug pattern PLp_P as described in FIGS. 2A and 2B.

In each of the peripheral conductive structures CSp', the peripheral interconnection line CPp may include a first portion extending from the plug pattern PLp_P and the first portion extending from the conductive barrier layer PLp_B and a second portion extending from the conductive barrier layer PLp_B and covering a lower surface of the first portion covering an upper surface of the peripheral interlayer insulating layer 43.

Among the peripheral conductive structures CSp', the third peripheral conductive structure CSp3" corresponding to the third peripheral conductive structure CSp3' described in FIG. 4 may include a peripheral contact plug PLp including a void VO in an upper portion penetrating the second peripheral interlayer insulating layer 42 as in FIG. 4.

The cell contact structures CSc in FIGS. 3A and 3B may be replaced with cell contact structures CSc' as illustrated in FIGS. 8A and 8B.

Each of the cell contact structures CSc' may include a cell contact plug PLc' and a cell contact pad CPc' extending from the cell contact plug PLc'.

The cell contact plug PLc' may include a lower portion 60 electrically connected to the second impurity region SDc2 and an intermediate portion 63 on the lower portion 60 as described in FIGS. 3A and 3B. The cell contact plug PLc' may further include an upper portion 69' on the intermediate portion 63 as illustrated in FIG. 8B.

The cell contact pad CPc' may extend from the upper portion 69'. The upper portion 69' may include a conductive pattern 69*b*' and a conductive barrier layer 69*a*' covering a side surface and a lower surface of the conductive pattern 69*b*', and the cell contact pad CPc' may include a portion extending from the conductive barrier layer 69*a*' and a portion extending from the conductive pattern 69'.

In a modified example, referring to FIG. 9, the peripheral gate spacers 33 in FIGS. 2A, 4, 5A, and 7 may be replaced with peripheral gate spacers 33' as in FIG. 9.

Each of the peripheral gate spacers 33' may include an internal spacer 27 and an external spacer 30'. The internal spacer 27 may be in contact with a side surface of the peripheral gate structure GSp. The internal spacer 27 may include an oxide which may be formed by thermally oxidizing a side surface of the peripheral gate structure GSp.

The external spacer 30' may include at least two insulating layers. One of the at least two insulating layers may be a low-κ dielectric. For example, the external spacer 30' may include a first insulating layer 30*a* and a second insulating layer 30*b*. The first insulating layer 30*a* may include a portion disposed between the second insulating layer 30*b* and the internal spacer 27 and a portion covering a lower surface of the second insulating layer 30*b*. The first insulating layer 30*a* may include a low-κ dielectric, and the second insulating layer 30*b* may include a material different from that of the first peripheral interlayer insulating layer 39', for example, silicon oxide.

Since the peripheral gate spacers 33' may include the first insulating layer 30*a* which may be formed of a low-κ dielectric, the peripheral gate spacers 33' may reduce parasitic capacitance between the peripheral gate electrodes 21*p* of the first and second peripheral gate structures GSp1 and GSp2 adjacent to each other. Accordingly, electrical performance of the semiconductor device 1 may be improved.

Figure 10:
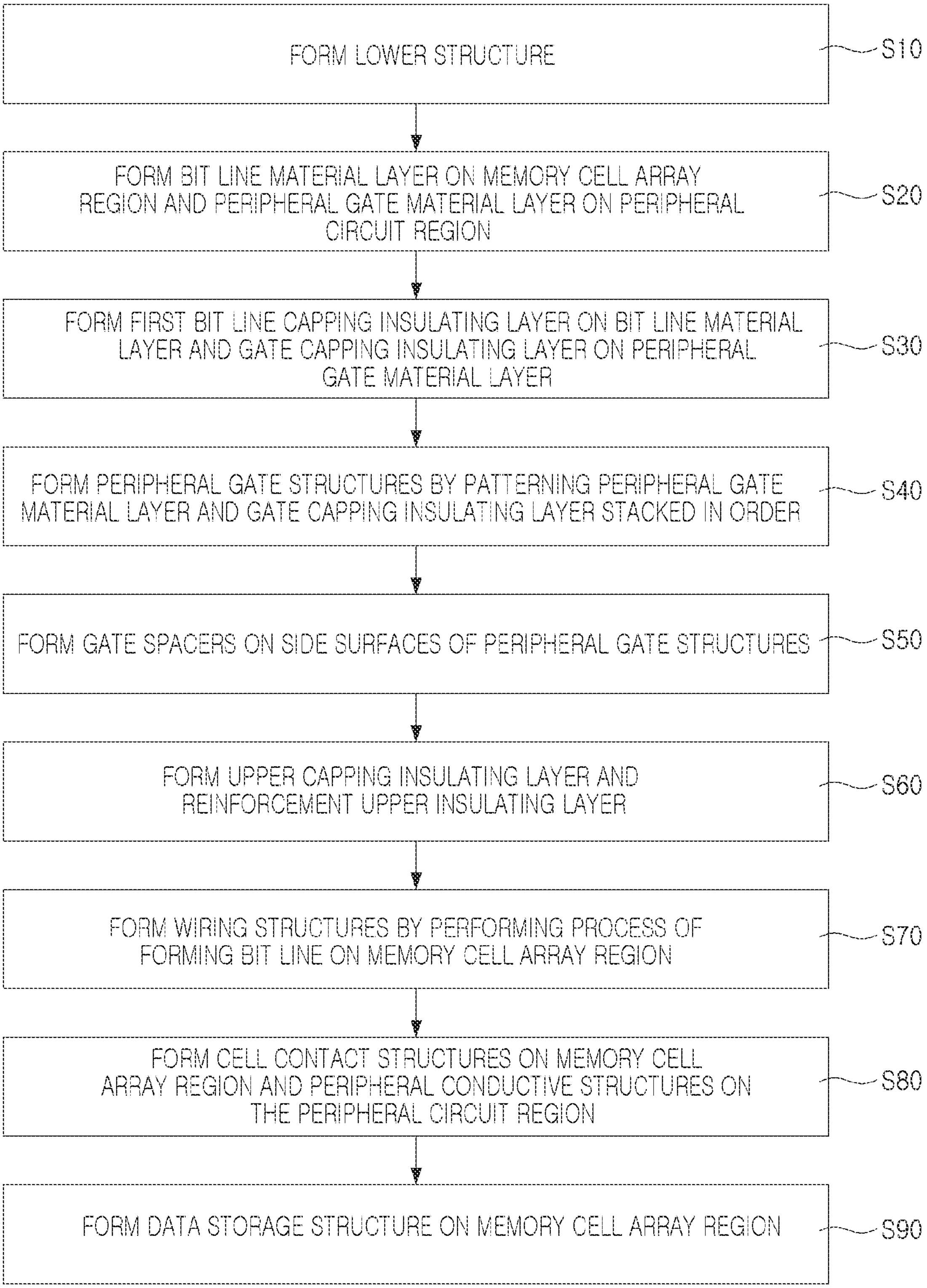
FIGS. 10 to 14*b* are diagrams illustrating an example of a method of manufacturing a semiconductor device.
Figure 11A:
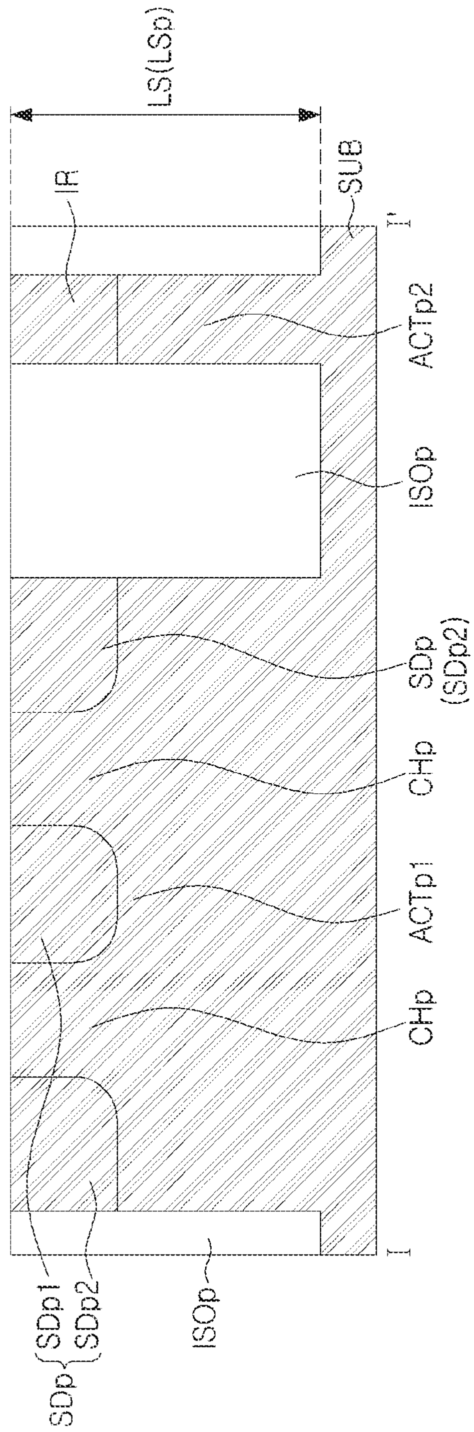
Figure 11B:
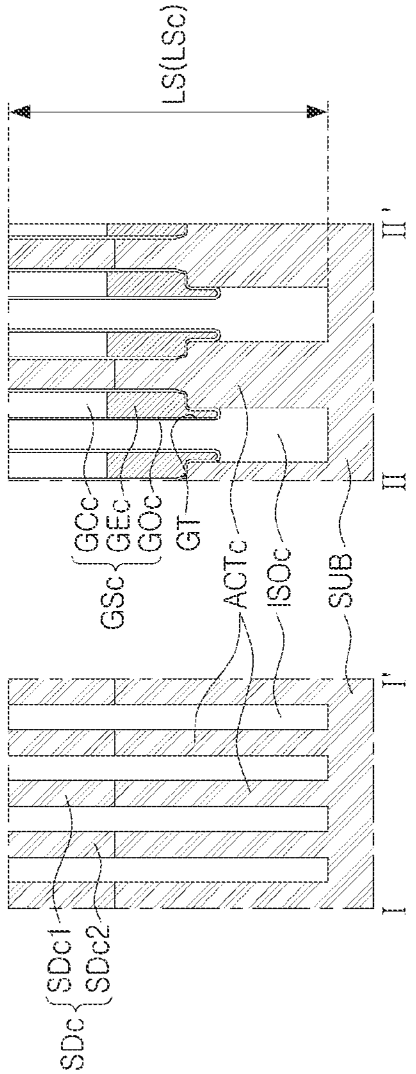
Figure 12A:
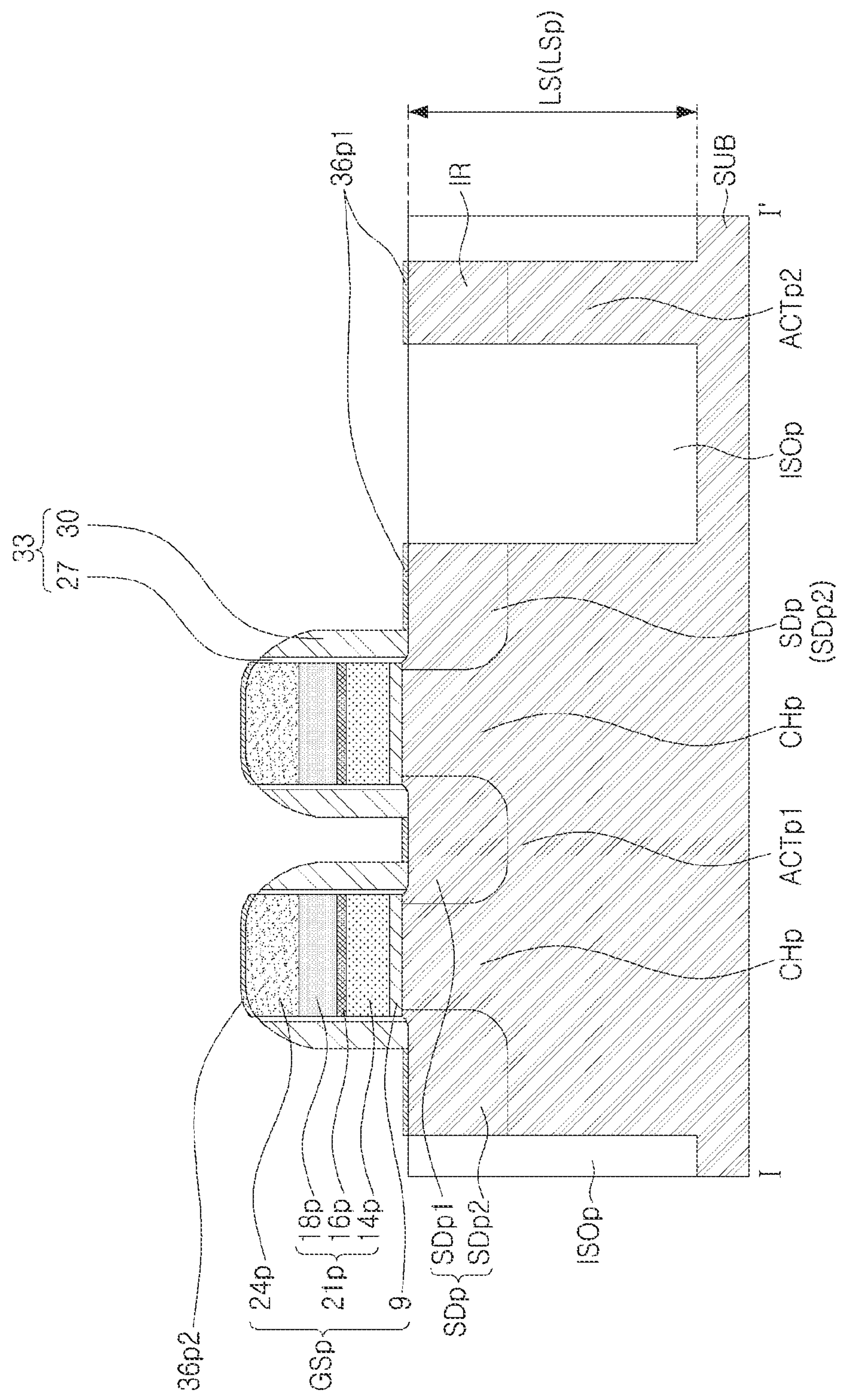
Figure 12B:
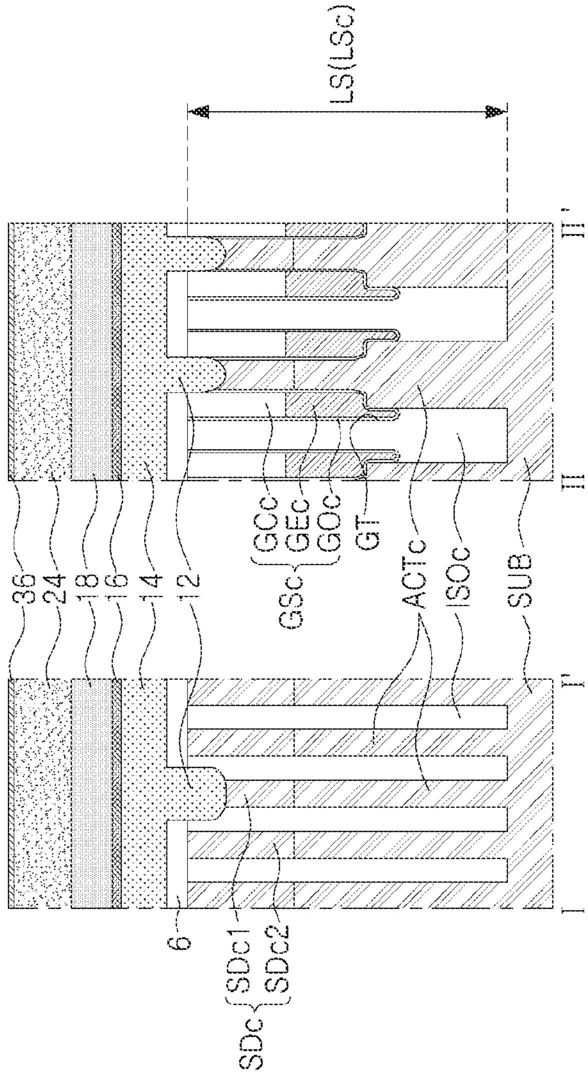

In the description below, an example of a method of manufacturing a semiconductor device according to an example implementation will be described with reference to FIGS. 1, and 10 to 14B. FIG. 10 is a process flow chart describing an example of a method of manufacturing a semiconductor device. FIGS. 11A, 12A, 13A, and 14A are cross-sectional diagrams illustrating a region taken along line I-I in FIG. 1. FIGS. 11B, 12B, 13B, and 14B are cross-sectional diagrams illustrating a region taken along line I-I in FIG. 1.

Referring to FIGS. 1, 10, 11A and 11B, a lower structure LS may be formed (S10). The lower structure LS may be formed on the substrate SUB. The substrate SUB may be implemented as a semiconductor substrate.

The lower structure LS may include a cell lower structure LSc on the memory cell array region MCA of the substrate SUB and a peripheral lower structure LSp on the peripheral circuit region PCA of the substrate SUB.

The forming the cell and peripheral lower structures LSc and LSp may include forming a peripheral device isolation region ISOp defining a first peripheral active region ACTp1 and a second peripheral active region ACTp2 and a cell device isolation region ISOc defining cell active region ACTc, forming a gate trench GT intersecting the cell active region ACTc and extends into the cell device isolation region ISOc, and forming a cell gate structure GSc in the gate trench GT.

Each of the cell gate structures GS may include a cell gate dielectric layer GOc conformally covering an internal wall of the gate trench GT, a cell gate electrode GEc partially filling the gate trench GT on the cell gate dielectric layer GOc, and a cell gate capping layer GCc on the cell gate electrode GEc.

The forming the cell lower structures LSc may further include forming cell source/drain regions SDc in an upper region of the cell active region ACTc.

Referring to FIGS. 1, 10, 12A and 12B, a bit line material layer on the memory cell array region MCA and a peripheral gate material layer on the peripheral circuit region PCA may be formed (S20).

Before forming the bit line material layer and the peripheral gate material layer, a buffer insulating layer 6 may be formed on the cell lower structure LSc.

The forming the bit line material layer may include forming a bit line contact hole penetrating through the buffer insulating layer 6, and forming bit line conductive layers filling the bit line contact hole and covering the buffer insulating layer 6.

The bit line conductive layers may include a plug portion 12 filling the bit line contact hole, and a first conductive layer 14, a second conductive layer 16, and a third conductive layer 18 stacked in order.

The forming the peripheral gate material layer may include forming a gate dielectric layer 9 and forming gate conductive layers 14*p*, 16*p*, and 18*p* on the gate dielectric layer 9. The gate conductive layers 14*p*, 16*p*, and 18*p* may include a first conductive layer 14*p*, a second conductive layer 16*p*, and a third conductive layer 18*p* stacked in order.

At least a portion of the gate conductive layers 14*p*, 16*p*, and 18*p* may be formed simultaneously with at least a portion of the bit line conductive layers.

A first bit line capping insulating layer 24 on the bit line material layer and a gate capping insulating layer 24*p* on the peripheral gate material layer may be formed (S30). The first bit line capping insulating layer 24 and the gate capping insulating layer 24*p* may be formed simultaneously.

Peripheral gate structures GSp may be formed by patterning the peripheral gate material layer and the gate capping insulating layer stacked in order (S40).

Each of the peripheral gate structures GSp may include a peripheral gate dielectric layer 9, a peripheral gate electrode 21*p*, and a peripheral gate capping layer 24*p* stacked in order. The peripheral gate electrode 21*p* may include the first conductive layer 14*p*, the second conductive layer 16*p* and the third conductive layer 18*p* stacked in order.

Gate spacers 33 may be formed on side surfaces of the peripheral gate structures GSp (S50). The forming the gate spacers 33 may include forming internal spacers 27 and external spacers 30 on side surfaces of the peripheral gate structures GSp in order.

Peripheral source/drain regions SDp in the first peripheral active region ACTp1 and the peripheral impurity region IR in the second peripheral active region ACTp2 may be formed.

The peripheral source/drain regions SDp may be formed in the first peripheral active region ACTp1 on both sides of the peripheral gate structures GSp.

A region of the first peripheral active region ACTp1 disposed between the peripheral source/drain regions SDp and disposed below the peripheral gate structures GSp may be defined as a channel region CHp.

In an example implementation, a first buffer insulating layer 36*p*1 on exposed surfaces of the first and second peripheral active regions ACTp1 and ACTp2, a second buffer insulating layer 36*p*2 on upper surfaces of the peripheral gate capping layers 24*p* of the peripheral gate structures GSp, and a third buffer insulating layer 36 on the first bit line capping insulating layer 24.

The first to third buffer insulating layers 36*p*1, 36*p*2, and 36 may be formed simultaneously. The first to third buffer insulating layers 36*p*1, 36*p*2, and 36 may be formed of an oxide.

Each of the first to third buffer insulating layers 36*p*1, 36*p*2, and 36 may have a thickness of about 20 Å or less.

Each of the first to third buffer insulating layers 36*p*1, 36*p*2, and 36 may have a thickness of about 15 Å or less.

In another implementation, the forming the first to third buffer insulating layers 36*p*1, 36*p*2, and 36 may not be performed.

Referring to FIGS. 1, 10, 13A and 13B, an upper capping insulating layer 39 and a reinforcement upper insulating layer may be formed (S60).

The upper capping insulating layer may cover the third buffer insulating layer 36 on the cell array region MCA, and may cover the first and second buffer insulating layers 36*p*1, 36*p*2 and the peripheral device isolation region ISOp on the peripheral circuit region PCA.

The upper capping insulating layer may have a first upper surface having a relatively high level in a region covering the peripheral gate structures GSp on the peripheral circuit region PCA, and may have a second upper surface having a relatively low level in a region without the peripheral gate structures GSp.

The reinforcement upper insulating layer may cover the upper capping insulating layer.

Referring to FIGS. 1, 10, 14A and 14B, a planarized insulating layer may be formed by planarizing the reinforcement upper insulating layer and the upper capping insulating layer.

The planarized insulating layer may be formed as a second bit line capping insulating layer 39 on the memory cell array region MCA, and may be formed as a peripheral interlayer insulating layer 43 on the peripheral circuit region PCA.

The second bit line capping insulating layer 39 may be formed by planarizing the upper capping insulating layer 39. The peripheral interlayer insulating layer 43 may include a first peripheral interlayer insulating layer 39' formed by planarizing the upper capping insulating layer 39 and a second peripheral interlayer insulating layer 42 formed by planarizing the reinforcement upper insulating layer. A material of the second bit line capping insulating layer 39 and a material of the first peripheral interlayer insulating layer 39' may be the same.

Accordingly, the peripheral interlayer insulating layer 43 including the first peripheral interlayer insulating layer 39' and the second peripheral interlayer insulating layer 42 as illustrated in FIG. 4 may be formed.

Figure 13A:
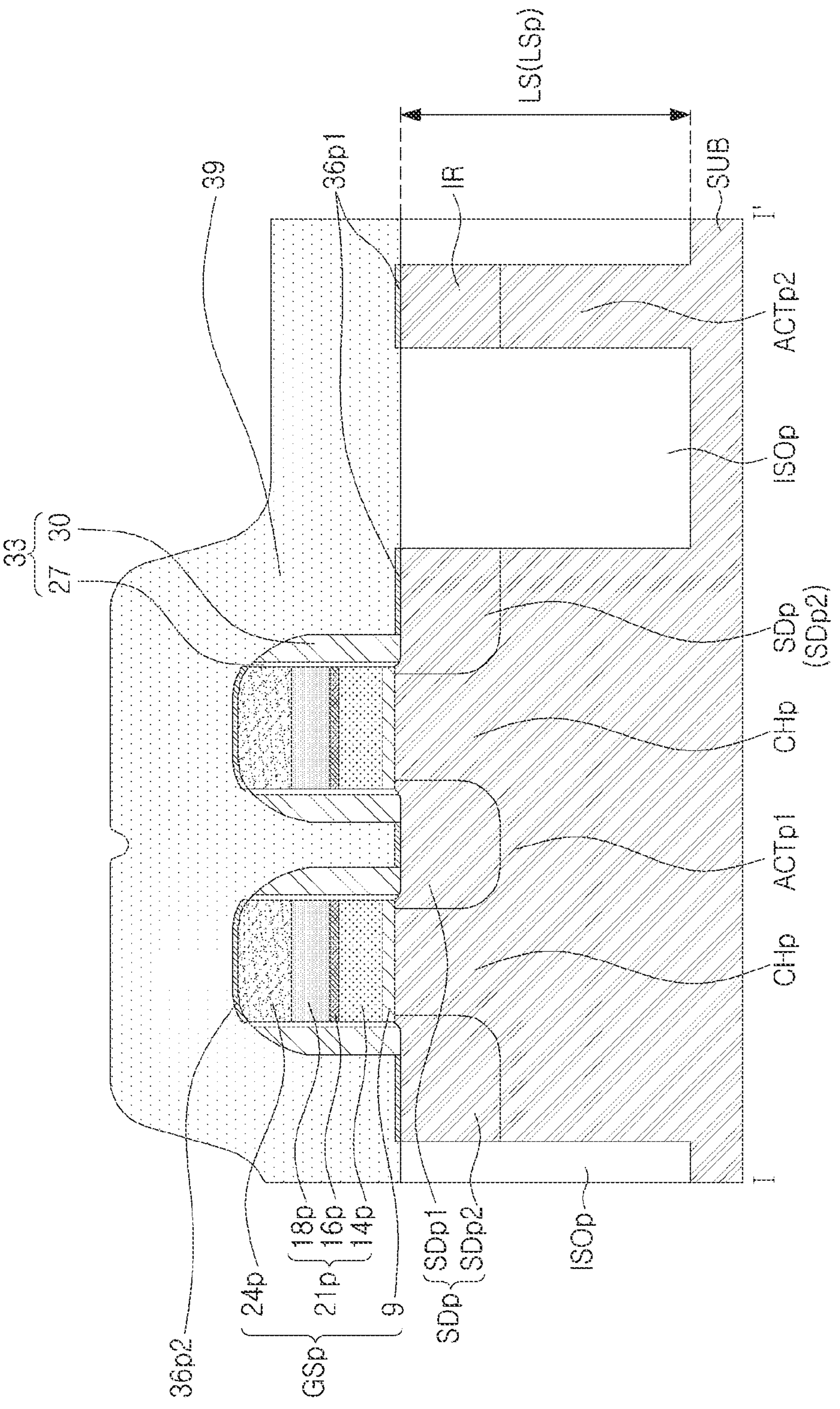
Figure 13B:
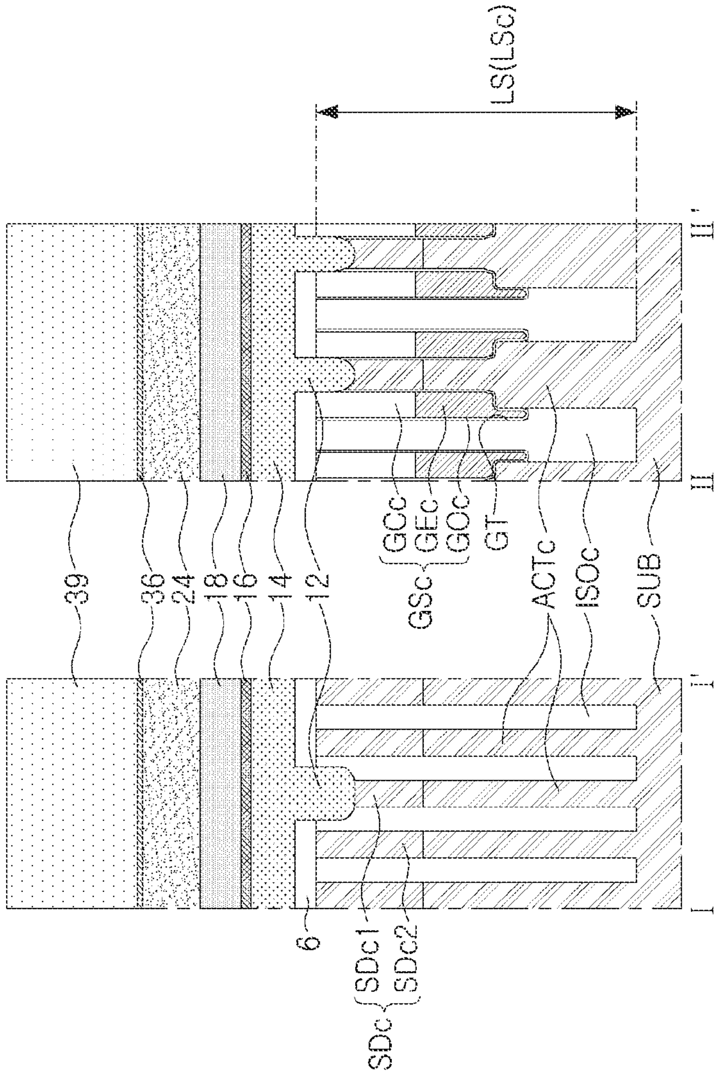
Figure 14A:
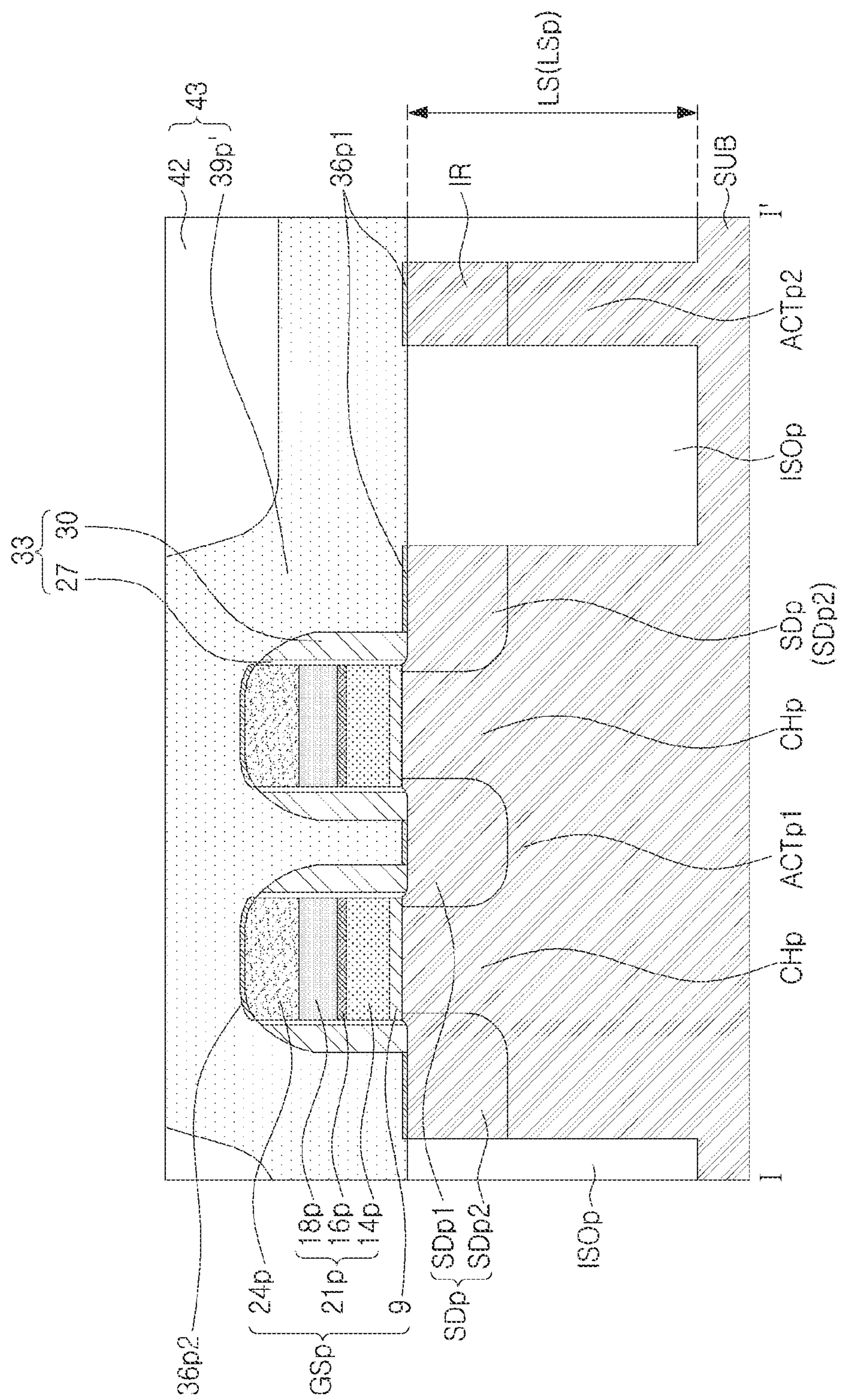
Figure 14B:
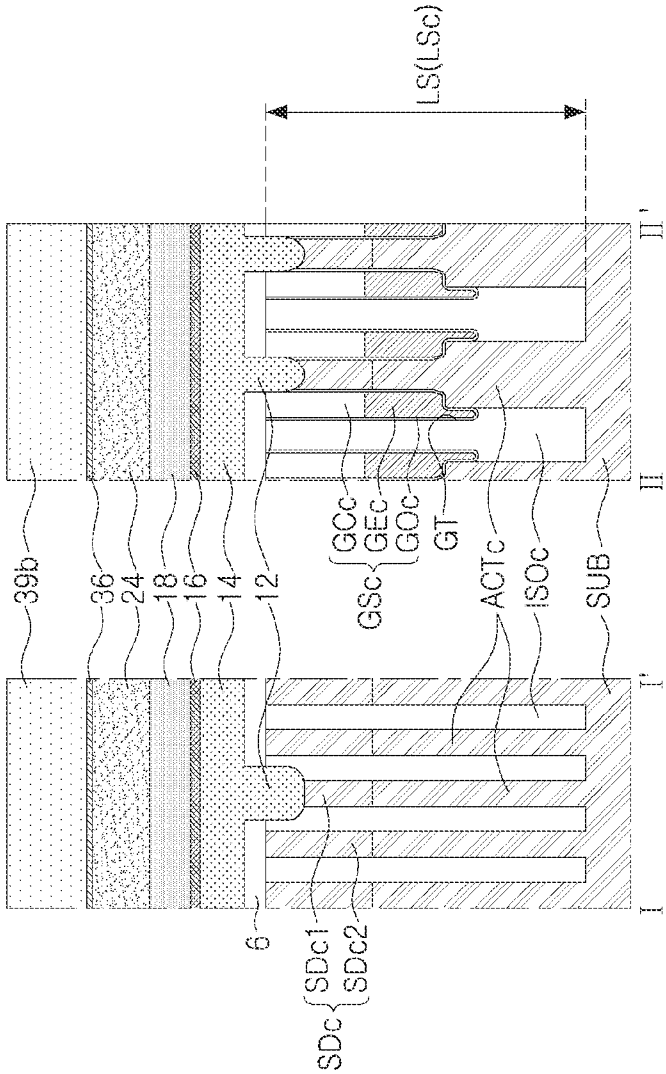

In another example, in the upper capping insulating layer 39 on the peripheral circuit region PCA described with reference to FIGS. 13A and 13B, when the second upper surface in the region without the peripheral gate structures GSp is formed at the same level as or higher than a level of an upper surface of the peripheral interlayer insulating layer 43, the entire reinforcement upper insulating layer may be removed while the reinforcement upper insulating layer and the upper capping insulating layer are planarized, and the upper capping insulating layer 39 may remain and may be formed as the peripheral interlayer insulating layer **39*p* as illustrated in FIG. 2**A.

Referring again to FIGS. 1, 2A, 2B, 3A and 3B or 5A and 5B, wiring structures BS may be formed by performing a process of forming a bit line on the memory cell array region MCA (S70). Spacer structures SP may be formed on side surfaces of the wiring structures BS.

Each of the wiring structures BS may include a bit line structure BL and a bit line capping pattern BC on the bit line structure BL.

The bit line structure BL may be formed by patterning the bit line conductive layers, and the bit line capping pattern BC may include a lower bit line capping layer 24B, a third buffer insulating layer (36B in FIG. 6) and an upper bit line capping layer **39*b* stacked in order. The lower bit line capping layer 24B may be formed by patterning the first bit line capping insulating layer 24, the third buffer insulating layer (36B in FIG. 6) may be formed by patterning the third buffer insulating layer 36, and the upper bit line capping layer 39*b* may be formed by patterning the second bit line capping insulating layer 39**.

The third buffer insulating layer (36B in FIG. 6) may not be provided.

Cell contact structures CSc on the memory cell array region MCA and peripheral conductive structures CSp on the peripheral circuit region PCA may be formed (S80).

Each of the cell contact structures CSc may include a cell contact plug PLc and a cell contact pad CPc on the cell contact plug PLc. Each of the peripheral conductive structures CSp may include a peripheral contact plug PLp and a peripheral interconnection line CPp.

In the example implementation in FIG. 2A, the peripheral contact plug PLp may penetrate through the peripheral interlayer insulating layer **39*p***.

In the example implementation in FIG. 4, the peripheral contact plugs PLp of the first and second peripheral conductive structures CSp1, CSp**2*a*, and CSp2B may penetrate through the first peripheral interlayer insulating layer 39', and the peripheral contact plug PLp of the third peripheral conductive structure CSp3' may penetrate through the first and second peripheral interlayer insulating layers 39' and 42**.

The first peripheral interlayer insulating layer 39' may have an upper surface disposed at a level higher than a level of the upper surface of the peripheral gate capping layer **24*p* and a lower surface disposed at a level lower than a level of the lower surface of the peripheral gate electrode 21*p***, and may be formed as a single material layer.

In an example implementation, in a region in which arrangement density of the peripheral gate structures GSp is relatively high, the peripheral contact plugs PLp of the first and second peripheral conductive structures CSp1, CSp**2*a*, and CSp2B may penetrate through the first peripheral interlayer insulating layer 39'** formed as a single material layer and may be connected to the first peripheral active region ACTp, process defects occurring in the process of forming the peripheral contact plugs PLp may be prevented.

A cell insulating isolation pattern SPc extending downwardly while filling a region between side surfaces of the cell pad patterns CPc and a peripheral insulating isolation pattern SPp extending downwardly while filling a region between the peripheral interconnection lines CPp may be formed.

Thereafter, a peripheral etch stop layer ESLp on the peripheral circuit region PCA and a cell etch stop layer ESLc on the memory cell array region MCA may be formed.

A data storage structure DS may be formed on the memory cell array region MCA (S90). The data storage structure DS may include a first electrodes 80 penetrating through the cell etch stop layer ESLc and electrically connected to the pad patterns CPc, a dielectric layer 82 covering the first electrode 80 and the etch stop layer ESLc, and a second electrode 84 on the dielectric layer 82.

An upper insulating layer UILD on the peripheral etch stop layer ESLp, and a peripheral contact penetrating through the upper insulating layer UILD and the peripheral etch stop layer ESLp and electrically connected to the peripheral interconnection line CPp structure MC may be formed on the peripheral circuit region PCA.

According to the aforementioned example implementations, a lower bit line capping layer among bit line capping patterns disposed on the bit line and a peripheral interlayer insulating layer covering the peripheral gate structure may be formed of the same material. Accordingly, since the lower bit line capping layer and the peripheral interlayer insulating layer may be formed by the single process, productivity of a semiconductor device may be improved.

Also, a peripheral contact plug connected to the peripheral source/drain region may be formed to penetrate through one of the peripheral interlayer insulating layers, thereby preventing contact process defects occurring when the peripheral interlayer insulating layer is formed as at least two peripheral interlayer insulating layers. Accordingly, a semiconductor device including a peripheral contact plug having reliability may be provided.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

While the example implementations have been illustrated and described above, it will be configured as apparent to those skilled in the art that modifications and variations may be made without departing from the scope in the example implementation as defined by the appended claims.

What is claimed is:

1. A semiconductor device, comprising:
a bit line structure and a bit line capping pattern that are stacked on a memory cell array region of a substrate;
a peripheral gate structure on a peripheral circuit region of the substrate, the peripheral gate structure including a peripheral gate dielectric layer, a peripheral gate electrode on the peripheral gate dielectric layer, and a peripheral gate capping pattern on the peripheral gate electrode;
a gate spacer on a side surface of the peripheral gate structure;
a first peripheral interlayer insulating layer on the peripheral circuit region of the substrate, the first peripheral interlayer insulating layer covering the peripheral gate structure and the gate spacer; and
a first peripheral contact plug penetrating through the first peripheral interlayer insulating layer,
wherein the bit line capping pattern includes a lower bit line capping layer and an upper bit line capping layer that are stacked,
wherein a material of the upper bit line capping layer is same as a material of the first peripheral interlayer insulating layer,
wherein an upper end of the first peripheral interlayer insulating layer is disposed at a level higher than a level of an upper surface of the peripheral gate capping pattern, and
wherein a lower end of the first peripheral interlayer insulating layer is disposed at a level lower than a level of a lower surface of the peripheral gate electrode.

2. The semiconductor device of claim 1,
wherein a material of the lower bit line capping layer is a same as a material of the peripheral gate capping pattern, and
wherein at least a portion of the lower bit line capping layer is at a same level as at least a portion of the peripheral gate capping pattern.

3. The semiconductor device of claim 1, further comprising:
a buffer insulating layer between the peripheral gate capping pattern and the first peripheral interlayer insulating layer.

4. The semiconductor device of claim 3,
wherein the peripheral gate capping pattern and the first peripheral interlayer insulating layer include a SiN material, and
wherein the buffer insulating layer includes a SiON material.

5. The semiconductor device of claim 3,
wherein the buffer insulating layer has a thickness smaller than a thickness of the peripheral gate dielectric layer.

6. The semiconductor device of claim 3,
wherein the bit line capping pattern further includes a buffer capping layer between the lower bit line capping layer and the upper bit line capping layer,
wherein the buffer capping layer and the buffer insulating layer include a same material with each other, and
wherein a thickness of the buffer capping layer is substantially a same as a thickness of the buffer insulating layer.

7. The semiconductor device of claim 1, further comprising:
a second peripheral interlayer insulating layer; and
a second peripheral contact plug,
wherein the first peripheral interlayer insulating layer has a first upper surface and a second upper surface at a level lower than a level of the first upper surface,
wherein the second peripheral interlayer insulating layer is on the second upper surface of the first peripheral interlayer insulating layer, and
wherein the second peripheral contact plug penetrates through the second peripheral interlayer insulating layer and the first peripheral interlayer insulating layer.

8. The semiconductor device of claim 7, further comprising:
a first peripheral interconnection line disposed on the first peripheral contact plug and the first peripheral interlayer insulating layer, the first peripheral interconnection line contacting the first upper surface of the first peripheral interlayer insulating layer; and
a second peripheral interconnection line disposed on the second peripheral contact plug and the second peripheral interlayer insulating layer, the second peripheral interconnection line contacting an upper surface of the second peripheral interlayer insulating layer.

9. The semiconductor device of claim 7,
wherein an upper surface of the first peripheral contact plug and an upper surface of the second peripheral interlayer insulating layer are coplanar with each other.

10. The semiconductor device of claim 7,
wherein a width of the second peripheral contact plug is greater than a width of the first peripheral contact plug at a same level as the second peripheral interlayer insulating layer.

11. The semiconductor device of claim 7,
wherein the second peripheral contact plug further includes a void,
wherein the second peripheral contact plug includes an upper portion penetrating through the second peripheral interlayer insulating layer and a lower portion penetrating through the first peripheral interlayer insulating layer, and
wherein the void is in the upper portion of the second peripheral contact plug.

12. The semiconductor device of claim 1, wherein the gate spacer includes an internal spacer and an external spacer, wherein at least a portion of the internal spacer is disposed between the external spacer and the peripheral gate structure, wherein the external spacer includes at least two insulating layers, and wherein one of the at least two insulating layers includes a low-κ dielectric having a dielectric constant lower than a dielectric constant of silicon oxide.

13. The semiconductor device of claim 1, wherein the first peripheral contact plug includes a plug pattern and a barrier layer on a side surface of the plug pattern.

14. The semiconductor device of claim 13, further comprising:

a peripheral interconnection line disposed on the first peripheral contact plug and an upper surface of the first peripheral interlayer insulating layer, wherein the peripheral interconnection line contacts an upper surface of the plug pattern, an upper end of the barrier layer, and the upper surface of the first peripheral interlayer insulating layer.

15. The semiconductor device of claim 13, further comprising:

a peripheral interconnection line disposed on the first peripheral contact plug and an upper surface of the first peripheral interlayer insulating layer, wherein the peripheral interconnection line includes a first portion extending from the plug pattern and a second portion extending from the barrier layer, and wherein the second portion covers a bottom surface of the first portion.

16. A semiconductor device, comprising:

a first structure disposed on a memory cell array region of a substrate, the first structure including a cell gate structure and a cell device isolation region defining a cell active region;

a second structure disposed on a peripheral circuit region of the substrate, the second structure including a peripheral device isolation region defining a peripheral active region;

a bit line structure and a bit line capping pattern that are stacked on the first structure;

a peripheral gate structure on the second structure;

gate spacers on side surfaces of the peripheral gate structure;

a peripheral interlayer insulating layer disposed on the second structure and covering the peripheral gate structure and the gate spacers;

a peripheral contact plug penetrating through the peripheral interlayer insulating layer and electrically connected to a peripheral source/drain region in the peripheral active region; and a peripheral interconnection line electrically connected to the peripheral contact plug and in contact with an upper surface of the peripheral interlayer insulating layer, wherein the peripheral gate structure includes a peripheral gate dielectric layer, a peripheral gate electrode, and a peripheral gate capping pattern that are stacked, wherein a bottom end of the peripheral interlayer insulating layer is disposed at a level lower than a level of a bottom surface of the peripheral gate electrode, wherein the bit line capping pattern includes a lower bit line capping layer and an upper bit line capping layer that are stacked, and wherein a material of the upper bit line capping layer is same as a material of the peripheral interlayer insulating layer.

17. The semiconductor device of claim 16, wherein a material of the lower bit line capping layer is same as a material of the peripheral gate capping pattern.

18. The semiconductor device of claim 16, wherein the upper bit line capping layer and the peripheral interlayer insulating layer include a SiN material.

19. A semiconductor device, comprising:

a first structure disposed on a memory cell array region of a substrate, the first structure including a cell gate structure and a cell device isolation region defining a cell active region;

a second structure disposed on a peripheral circuit region of the substrate, the second structure including a peripheral device isolation region defining a peripheral active region;

a bit line structure and a bit line capping pattern that are stacked on the first structure;

peripheral gate structures intersecting the peripheral active region and separate from each other on the second structure;

gate spacers on side surfaces of the peripheral gate structures;

a peripheral interlayer insulating layer disposed on the second structure and covering the peripheral gate structures and the gate spacers;

a peripheral contact plug penetrating through the peripheral interlayer insulating layer, electrically connected to a peripheral source/drain region in the peripheral active region, disposed between the peripheral gate structures and in contact with the gate spacers; and a peripheral interconnection line electrically connected to the peripheral contact plug and in contact with a top surface of the peripheral interlayer insulating layer, wherein each of the peripheral gate structure includes a peripheral gate dielectric layer, a peripheral gate electrode, and a peripheral gate capping pattern that are stacked, wherein a bottom end of the peripheral interlayer insulating layer is disposed at a level lower than a level of a bottom surface of the peripheral gate electrode, wherein the bit line capping pattern includes a lower bit line capping layer and an upper bit line capping layer that are stacked, and wherein a material of the upper bit line capping layer is same as a material of the peripheral interlayer insulating layer.

20. The semiconductor device of claim 19, further comprising:

a buffer insulating layer between the peripheral gate capping pattern and the peripheral interlayer insulating layer, wherein the bit line capping pattern further includes a buffer capping layer between the lower bit line capping layer and the upper bit line capping layer, wherein the buffer insulating layer and the buffer capping layer include a same material, wherein each of the buffer insulating layer and the buffer capping layer has a thickness of about 20 Å or less, wherein the peripheral interlayer insulating layer includes silicon nitride, and wherein each of the gate spacers includes at least one of silicon oxide and a low-κ dielectric having a dielectric constant lower than a dielectric constant of silicon oxide.

* * * * *